(12) United States Patent
Harigai et al.

(10) Patent No.: US 8,931,342 B2
(45) Date of Patent: Jan. 13, 2015

(54) PIEZOELECTRIC FILM AND METHOD OF MANUFACTURING THE SAME, INK JET HEAD, METHOD OF FORMING IMAGE BY THE INK JET HEAD, ANGULAR VELOCITY SENSOR, METHOD OF MEASURING ANGULAR VELOCITY BY THE ANGULAR VELOCITY SENSOR, PIEZOELECTRIC GENERATING ELEMENT, AND METHOD OF GENERATING ELECTRIC POWER USING THE PIEZOELECTRIC GENERATING ELEMENT

(71) Applicant: Panasonic Corporation, Osaka (JP)

(72) Inventors: Takakiyo Harigai, Kyoto (JP); Yoshiaki Tanaka, Nara (JP); Hideaki Adachi, Osaka (JP); Eiji Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/943,343

(22) Filed: Jul. 16, 2013

(65) Prior Publication Data

US 2013/0298674 A1 Nov. 14, 2013

Related U.S. Application Data

(60) Division of application No. 13/550,994, filed on Jul. 17, 2012, now Pat. No. 8,511,162, which is a continuation of application No. PCT/JP2011/003664, filed on Jun. 28, 2011.

(30) Foreign Application Priority Data

Jun. 30, 2010 (JP) ................................. 2010-148728

(51) Int. Cl.
*G01P 15/09* (2006.01)
*H01L 41/187* (2006.01)
(Continued)

(52) U.S. Cl.
CPC ............ *G01P 15/09* (2013.01); *H01L 41/1878* (2013.01); *H01L 41/1136* (2013.01);
(Continued)

(58) Field of Classification Search
CPC ....... G01P 15/09; B41J 2/14233; G01C 19/56
USPC ...................................................... 73/504.12
See application file for complete search history.

(56) References Cited

U.S. PATENT DOCUMENTS 6,231,779 B1  5/2001  Chiang et al.
(Continued)

FOREIGN PATENT DOCUMENTS

CN  1461703 A  12/2003
(Continued)

OTHER PUBLICATIONS

Guo, Piping et al. "Structure and electrical properties of trilayered BaTiO3/(Na0.5)TiO3—BaTiO3/BaTiO3 thin films deposited on Si substrate." Solid States Communications. pp. 14-17. Available online Oct. 30, 2008.
(Continued)

*Primary Examiner* — Hezron E Williams
*Assistant Examiner* — Gregory J Redmann
(74) *Attorney, Agent, or Firm* — McDermott Will & Emery LLP

(57) ABSTRACT

The purpose of the present invention is to provide an angular velocity sensor capable of measuring an exact angular velocity, an ink jet head capable of producing an exact amount of ink, and a piezoelectric generating element capable of generating electric power due to positive piezoelectric effect. In the present invention, a piezoelectric film comprising a first electrode, a piezoelectric layer, and a second electrode is used. The first electrode comprises an electrode layer having a (001) orientation. The piezoelectric layer comprises a $(Na_x Bi_y)TiO_{0.5x+1.5y+2}$—$BaTiO_3$ layer ($0.30 \leq x \leq 0.46$ and $0.51 \leq y \leq 0.62$) having a (001) orientation.

3 Claims, 10 Drawing Sheets

(51) Int. Cl.
*H01L 41/113* (2006.01)
*G01C 19/5628* (2012.01)
*H01L 41/09* (2006.01)
*G01C 19/56* (2012.01)
*B41J 2/14* (2006.01)
*H01L 41/047* (2006.01)
*H01L 41/08* (2006.01)
*H01L 41/316* (2013.01)

(52) U.S. Cl.
CPC ........ *G01C19/5628* (2013.01); *H01L 41/0973* (2013.01); *G01C 19/56* (2013.01); *B41J 2/14233* (2013.01); *B41J 2002/14258* (2013.01); *H01L 41/0478* (2013.01); *H01L 41/187* (2013.01); *H01L 41/0805* (2013.01); *H01L 41/316* (2013.01)
USPC ..................................................... 73/504.12

(56) References Cited

U.S. PATENT DOCUMENTS

| | | | |
|---|---|---|---|
| 2002/0036282 A1 | 3/2002 | Chiang et al. | |
| 2003/0222947 A1 | 12/2003 | Tomozawa et al. | |
| 2004/0139911 A1 | 7/2004 | Chiang et al. | |
| 2005/0109263 A9 | 5/2005 | Chiang et al. | |
| 2005/0280335 A1 | 12/2005 | Tomozawa et al. | |
| 2006/0119229 A1 | 6/2006 | Koizumi et al. | |
| 2010/0194245 A1 | 8/2010 | Harigai et al. | |
| 2011/0072900 A1 | 3/2011 | Harigai et al. | |
| 2011/0143146 A1 | 6/2011 | Harigai et al. | |

FOREIGN PATENT DOCUMENTS

| | | |
|---|---|---|
| CN | 101981718 A | 2/2011 |
| JP | 04-60073 | 9/1992 |
| JP | 2001-261435 | 9/2001 |
| JP | 2006-165007 | 6/2006 |
| JP | 2007-266346 | 10/2007 |
| JP | 2010-241615 A | 10/2010 |
| WO | WO 2010/047049 A1 | 4/2010 |
| WO | WO 2010/122707 A1 | 10/2010 |

OTHER PUBLICATIONS

Chinese Search Report issued in Chinese Application No. 201180019117.9 dated May 30, 2014.

PIEZOELECTRIC FILM AND METHOD OF MANUFACTURING THE SAME, INK JET HEAD, METHOD OF FORMING IMAGE BY THE INK JET HEAD, ANGULAR VELOCITY SENSOR, METHOD OF MEASURING ANGULAR VELOCITY BY THE ANGULAR VELOCITY SENSOR, PIEZOELECTRIC GENERATING ELEMENT, AND METHOD OF GENERATING ELECTRIC POWER USING THE PIEZOELECTRIC GENERATING ELEMENT

CROSS REFERENCE TO RELATED APPLICATIONS

This is a Divisional of U.S. application Ser. No. 13/550,994, filed Jul. 17, 2012, which in turn is a Continuation of International Application No. PCT/JP2011/003664, with an international filing date of Jun. 28, 2011, which claims priority of Japanese Patent Application No. 2010-148728, filed on Jun. 30, 2010, the contents of which are hereby incorporated by reference.

TECHNICAL FIELD

The present invention relates to a piezoelectric film including a piezoelectric layer and a method of manufacturing the same. The present invention further relates to an ink jet head including the piezoelectric film and a method of forming an image by the head, to an angular velocity sensor including the piezoelectric film and a method of measuring an angular velocity by the sensor, and to a piezoelectric generating element including the piezoelectric film and a method of generating electric power using the element.

BACKGROUND ART

Lead zirconate titanate (PZT: $Pb(Zr_xTi_{1-x})O_3$, $0<x<1$) is a typical ferroelectric material capable of storing a large amount of electric charge, and used in capacitors and film memories. PZT has pyroelectricity and piezoelectricity based on the ferroelectricity thereof. PZT has high piezoelectric performance, and its mechanical quality factor Qm can be controlled easily by adjusting the composition or adding an element thereto. This allows PZT to be applied to sensors, actuators, ultrasonic motors, filter circuits, and oscillators.

PZT, however, contains a large amount of lead. In recent years, there has been a growing concern that lead leached from waste may cause serious damage to the ecosystem and the environment. Accordingly, there has been an international movement toward restricting the use of lead. For this reason, non-lead-containing (that is, lead-free) ferroelectric materials, unlike PZT, have been in demand.

One of the lead-free ferroelectric materials that are currently under development is, for example, a perovskite-type composite oxide $[(Bi_{0.5}Na_{0.5})_{1-y}Ba_y]TiO_3$ made of bismuth (Bi), sodium (Na), barium (Ba), and titanium (Ti).

FIG. 11 shows the FIG. 1 in Patent Literature 1. The piezoelectric element shown in FIG. 11 comprises a substrate 11, an electrode layer 12, and a piezoelectric layer 13. These layers 11-13 are laminated in this order. An example of the material of the substrate 11 is zirconium oxide, aluminum oxide, magnesium oxide, nitride aluminum, or nitride silicon. An example of the material of the electrode layer 12 is platinum. An example of the material of the piezoelectric layer 13 is perovskite-like composite oxide $[(Bi_{0.5}Na_{0.5})_{1-y}Ba_y]TiO_3$.

The present inventors fabricated a piezoelectric film comprising a laminate of Si(100)/Pt(111)/perovskite-like composite oxide $[(Bi_{0.5}Na_{0.5})_{1-y}Ba_y]TiO_3$ according to Patent Literature 1 except that a Si substrate was used. However, the piezoelectric film was little oriented to a (001) orientation as described in the comparative example 1, which is described later.

Non Patent Literature 1 discloses that a $LaNiO_3$ layer disposed on a substrate has a (001) orientation regardless of the orientation direction of the substrate.

The present inventors arranged a $LaNiO_3$ layer between a Pt (111) layer and a perovskite-like composite oxide $[(Bi_{0.5}Na_{0.5})_{1-y}Ba_y]TiO_3$ layer on the basis of Non Patent Literature 1. In other words, the present inventors fabricated a piezoelectric film comprising a laminate composed of Si(100)/Pt(111)/(001)$LaNiO_3$ layer/perovskite-like composite oxide $[(Bi_{0.5}Na_{0.5})_{1-y}Ba_y]TiO_3$. However, the piezoelectric film was not sufficiently oriented to a (001) orientation as described in the comparative example 2, which is described later.

Patent Literature 2 discloses $(Na_xBi_y)TiO_{0.5x+1.5y+2}$—$BaTiO_3$ layers having various composition of bismuth and sodium.

The present inventors varied the composition of bismuth and sodium on the basis of "BNT__08 7" disclosed in Table 1 of Patent literature 2. The BNT__08 7 is a $(Na_xBi_y)TiO_{0.5x+1.5y+2}$—$BaTiO_3$ layer (x=0.29, y=0.43). This allows the sufficient orientation to a (001) orientation. In other words, the present inventors fabricated a piezoelectric film comprising a laminate composed of Si(100)/Pt(111)/(001)$LaNiO_3$ layer/perovskite-like composite oxide $[(Bi_{0.43}Na_{0.29})_{1-y}Ba_y]TiO_3$.

However, an amount of the deformation of the obtained piezoelectric film with regard to an applied voltage varied like a quadratic function as described in the comparative example 3, which is described later.

An amount of the deformation of a piezoelectric film with regard to an applied electric field is described below with reference to FIG. 12.

The amount of the deformation is required to be proportional to an electric field for an angular velocity sensor capable of measuring an exact angular velocity, an ink jet head capable of spraying an exact amount of ink, and a piezoelectric generating element capable of generating electric power due to positive piezoelectric effect. In other words, the amount B of the deformation and the electric field A are required to satisfy the following equation (1).

$$B = c_1 \cdot A \qquad \text{Equation (1)}$$

($c_1$ is constant)

The term "proportion" used in the present specification means that an amount B of the deformation and an electric field A satisfy the above-mentioned equation 1. In other words, the term "proportion" means a linear function. The term "proportion" does not include a quadratic function.

FIG. 12(a) shows a graph of an electric field—an amount of the deformation of the piezoelectric film where the amount of the deformation is proportional to the electric field. See FIG. 4 in Patent Literature 2. FIG. 12(b) shows an enlarged view of a portion surrounded by a dashed line in FIG. 12(a).

As shown in FIG. 12(b), the slope of a tangent line at the dot A is the substantially same as the slope of a tangent line at the dot B. The phrase "substantially same" means that a ratio represented by the slope of the tangent line at the dot A/the slope of the tangent line at the dot B is not less than 0.8 and not more than 1.2. This means that the amount B of the deformation is proportional to the electric field A. The electric field intensities at the dot A and at the dot B are, for example, 3 volts/micrometer and 10 volts/micrometer, respectively.

On the contrary, FIG. 12(c) shows a graph of an electric field—an amount of the deformation of the piezoelectric film where the amount of the deformation varies like a quadratic function with regard to the electric field. FIG. 12(d) shows an enlarged view of a portion surrounded by a dashed line in FIG. 12(c).

As shown in FIG. 12(d), the tangent line at the dot C has a shallower slope than the tangent line at the dot D. This means that the amount B of deformation varies with regard to the electric field A according to the following equation (2).

$$B = c_2 \cdot A^2 \qquad \text{Equation 2}$$

($c_2$ is constant)

The dot C and the dot D have the same electric field intensities as the dot A and the dot B, respectively.

When the amount B of the deformation and the electric field A have a relationship of a quadratic function, it is difficult to measure an exact angular velocity, to produce an exact amount of ink, and to generate electric power due to positive piezoelectric effect. The relationship of a quadratic function between the amount b of the deformation and the electric field A is not suitable for an angular velocity sensor capable of measuring an exact angular velocity, an ink jet head capable of spraying an exact amount of ink, and a piezoelectric generating element capable of generating electric power due to positive piezoelectric effect.

However, as described in the comparative example 3, the amount B of the deformation of the obtained piezoelectric film varied as shown in FIG. 12(c) and FIG. 12(d). Accordingly, the piezoelectric film is not suitable for an angular velocity sensor, an ink jet head, and a piezoelectric generating element.

CITATION LIST

Patent Literature

[Patent Literature 1]
Japanese Patent Application Publication No. 2006-165007
[Patent Literature 2]
United States Pre-Grant Patent Application Publication No. 2005/0109263
[Patent Literature 3]
Japanese Patent Application Publication No. 2001-261435
[Patent Literature 4]
International publication No. 2010/047049
[Patent Literature 5]
U.S. Pat. No. 7,870,787
[Patent Literature 6]
Chinese Patent Application Publication No. 101981718

Non Patent Literature

[Non Patent Literature 1]
Uchino Kenji, "piezoelectric/electrostrictive actuator", Morikita publishing company, page 24

SUMMARY OF INVENTION

One non-limiting and exemplary embodiment provides an angular velocity sensor capable of measuring an exact angular velocity, an ink jet head capable of producing an exact amount of ink, and a piezoelectric generating element capable of generating electric power due to positive piezoelectric effect.

Another purpose of the present invention is to provide a method for measuring an angular velocity with use of the above-mentioned angular velocity sensor, a method for forming an image with use of the above-mentioned ink jet head, and a method for generating electric power with use of the above-mentioned piezoelectric generating element.

A method of measuring an angular velocity with an angular velocity sensor of the present invention comprises steps of:

a step (a) of preparing the angular velocity sensor comprising a substrate having a vibration part and a piezoelectric film bonded to the vibration part, wherein, the piezoelectric film comprises a piezoelectric layer, a first electrode and a second electrode;

the piezoelectric layer is interposed between the first electrode and the second electrode;

the first electrode comprises an electrode layer with a (001) orientation;

the piezoelectric layer comprises a $(Na_xBi_y)TiO_{0.5x+1.5y+2}$—$BaTiO_3$ layer with a (001) orientation only;

x is not less than 0.30 and not more than 0.46;

y is not less than 0.51 and not more than 0.62;

the $(Na_xBi_y)TiO_{0.5x+1.5y+2}$—$BaTiO_3$ layer has composition around a Morphotropic Phase Boundary; and one of the first and second electrodes selected therefrom is constituted of an electrode group including a drive electrode and a sense electrode;

a step (b) of applying a driving voltage to the piezoelectric layer through the drive electrode and the other of the first and second electrodes selected therefrom to oscillate the vibration part; and a step (c) of measuring, through the other electrode and the sense electrode, a deformation of the vibration part caused by an angular velocity applied to the oscillating vibration part to obtain a value of the applied angular velocity;

wherein an amount B of the deformation B caused by the deformation and an electric field A between the first electrode and the second electrode satisfy the following equation:

$$B = cA$$

(c is a constant).

(Non-Obviousness of the Present Invention from Patent Literatures 1 to 3 and Non Patent Literature 1)

Patent Literature 3 discloses that an excess amount of Bi improves an (100) orientation of the perovskite-like composite oxide $[(Bi_{0.43}Na_{0.29})_{1-y}Ba_y]TiO_3$.

The $[(Bi_{0.29}Na_{0.43})_{1-y}Ba_y]TiO_3$ according to the comparative example 3 had a sufficient (100) orientation. Accordingly, a skilled person would not require to further improve the orientation of $[(Bi_{0.29}Na_{0.43})_{1-y}Ba_y]TiO_3$ according to the comparative example 3.

Furthermore, Patent Literature 3 fails to disclose or suggest that the use of the excess amount of Bi improves the unsuitable relationship between the amount B of the deformation and the applied electric field A. Still, Patent Literature 3 fails to disclose or suggest that the amount B of the deformation is proportional to the applied electric field A, as the result of the improvement.

BRIEF DESCRIPTION OF DRAWINGS

FIG. 12 $(a)$ shows a graph indicating the deformation is linear to applied electric field and FIG. 12$(b)$ magnifies the dashed line part in FIG. 12$(a)$. FIG. 12 $(c)$ shows a graph indicating the deformation varies like a quadratic function with regard to the electric field and FIG. 12$(d)$ magnifies the dashed line part in FIG. 12$(c)$.

DESCRIPTION OF EMBODIMENTS

Figure 1A:
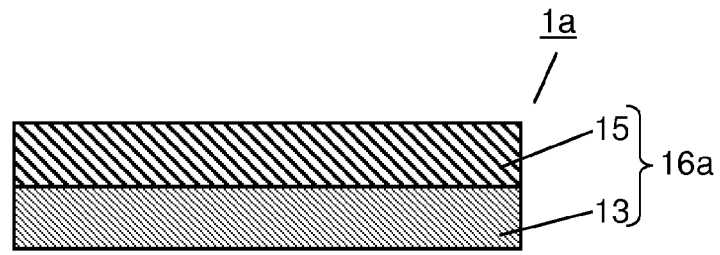
FIG. 1A is a cross-sectional view schematically showing an example of a piezoelectric film of the present invention.

Hereinafter, embodiments of the present invention will be described. In the following description, the same reference numerals are used to designate the same elements and parts, and therefore the overlapping description thereof can be omitted.

[Piezoelectric Film]

FIG. 1A shows one embodiment of a piezoelectric film according to the present invention. A piezoelectric film $1a$ shown in FIG. 1A has a multilayer structure $16a$. The multilayer structure $16a$ has an first electrode 13 with a (001) orientation and a $(Na_xBi_y)TiO_{0.5x+1.5y+2}$—$BaTiO_3$ layer 15 ($0.30 \leq x \leq 0.46$ and $0.51 \leq y \leq 0.62$) with a (001) orientation. In FIG. 1A, these layers 13 and 15 are laminated in contact with each other. The $(Na_xBi_y)TiO_{0.5x+1.5y+2}$—$BaTiO_3$ layer 15 is a piezoelectric layer. The $(Na_xBi_y)TiO_{0.5x+1.5y+2}$—$BaTiO_3$ layer 15 has a small leak current property, a high crystallinity, and a high (001) orientation. This allows the piezoelectric film $1a$ to have low dielectric loss and high piezoelectric performance comparable to that of PZT, although it contains no lead. Furthermore, the amount of the deformation of the piezoelectric film $1a$ is proportional to an applied electric field.

It is preferable that the first electrode 13 having a (001) orientation is made of lanthanum nickelate ($LaNiO_3$).

The $LaNiO_3$ layer has a perovskite-type crystal structure represented by a chemical formula $ABO_3$. The crystal structure has a lattice constant of 0.384 nm (pseudocubic crystal). Thus, the $LaNiO_3$ layer has a satisfactory lattice matching property with the $(Na_xBi_y)TiO_{0.5x+1.5y+2}$—$BaTiO_3$ layer 15. The $LaNiO_3$ layer has a (001) orientation regardless of the composition and crystal structure of a base layer thereof. For example, the $LaNiO_3$ layer 13 having a (001) orientation can be formed on a monocrystalline Si substrate having a lattice constant (0.543 nm) significantly different from that of the $LaNiO_3$ layer. The $LaNiO_3$ layer 13 having a (001) orientation can be formed also on a substrate made of an amorphous material such as glass, and a ceramic substrate.

The $LaNiO_3$ layer may contain a small amount of impurities. The impurity is typically a rare-earth element, which substitutes for La.

The $LaNiO_3$ is a conductive oxide. The first electrode 13 can serve as an electrode layer for applying a voltage to the $(Na_xBi_y)TiO_{0.5x+1.5y+2}$—$BaTiO_3$ layer 15.

Typically, the first electrode 13 can be formed by sputtering. The first electrode 13 can be formed by film formation techniques such as pulsed laser deposition (PLD), chemical vapor deposition (CVD), sol-gel processing, and aerosol deposition (AD).

In the piezoelectric film manufacturing method of the present invention, sputtering is used to form the first electrode 13 having a (001) orientation and made of $LaNiO_3$.

The $(Na_xBi_y)TiO_{0.5x+1.5y+2}$—$BaTiO_3$ layer 15 is formed on the first electrode 13 with a (001) orientation by sputtering.

The $(Bi,Na,Ba)TiO_3$ layer 15 with a (001) orientation is made of $(Na_xBi_y)TiO_{0.5x+1.5y+2}$—$BaTiO_3$ ($0.30 \leq x \leq 0.46$ and $0.51 \leq y \leq 0.62$). The $(Na_xBi_y)TiO_{0.5x+1.5y+2}$—$BaTiO_3$ layer 15 has a plane orientation of (110) on its surface.

The value of "0.5x+1.5y+2" which represents the oxygen amount in sodium.bismuth titanate may include error. For example, when x=0.41 and y=0.53, the value of "0.5×0.41+1.5×0.53+2" is equal to 3. However, even when the amount of sodium is 0.41 and the amount of bismuth is 0.53, the oxygen amount in sodium.bismuth titanate does not always correspond with the value of "3".

The thickness of the $(Na_xBi_y)TiO_{0.5x+1.5y+2}$—$BaTiO_3$ layer 15 is not limited. The thickness thereof is at least 0.5 μm but not more than 10 μm, for example. Even when the $(Na_xBi_y)TiO_{0.5x+1.5y+2}$—$BaTiO_3$ layer 15 is thin, the $(Na_xBi_y)TiO_{0.5x+1.5y+2}$—$BaTiO_3$ layer 15 has a low dielectric loss property and a high piezoelectric performance.

It is difficult to estimate the composition suitable for forming a piezoelectric layer having a high crystallinity, a high orientation, a low dielectric loss property, and a high piezoelectric performance equivalent to that of PZT expressing linear deformation behavior to the applied electric field based on the similarity of the lattice constants or the compositions of the piezoelectric layer. This is because it is generally difficult to form a thin film composed of a multicomponent composite oxide having high crystallinity and high orientation, like (Bi,Na,Ba)TiO$_3$, due to a difference in the vapor pressure of each constituent element (except for oxygen) of the oxide. The present inventors have discovered that the $(Na_xBi_y)TiO_{0.5x+1.5y+2}$—$BaTiO_3$ layer 15 has a high crystallinity and a high (001) orientation without use of a buffer layer.

The $(Na_xBi_y)TiO_{0.5x+1.5y+2}$—$BaTiO_3$ layer 15 has a perovskite-type crystal structure represented by the chemical formula $ABO_3$. The A site and B site in the perovskite structure have average valences of 2 and 4, respectively, depending on the placement of a single element or a plurality of elements. The A site is Bi, Na, and Ba. The B site is Ti. The $(Na_xBi_y)TiO_{0.5x+1.5y+2}$—$BaTiO_3$ layer 15 may contain a trace amount of impurities. The impurities typically may be Li and K to substitute for Na, and Sr and Ca to substitute for Ba, in the A site. The impurity typically may be Zr to substitute for Ti in the B site. Examples of the other impurities may include Mn, Fe, Nb, and Ta. Some of these impurities can improve the crystallinity and the piezoelectric performance of the $(Na_xBi_y)TiO_{0.5x+1.5y+2}$—$BaTiO_3$ layer 15

A (001)-oriented layer further may be optionally sandwiched between the first electrode 13 and the $(Na_xBi_y)TiO_{0.5x+1.5y+2}$—$BaTiO_3$ layer 15. The (001)-oriented layer is, for example, a Pt layer or a $SrRuO_3$ layer.

Typically, the $(Na_xBi_y)TiO_{0.5x+1.5y+2}$—$BaTiO_3$ layer 15 can be formed by sputtering. The $(Na_xBi_y)TiO_{0.5x+1.5y+2}$—$BaTiO_3$ layer 15 can be formed by other film formation techniques such as PLD, CVD, sol-gel processing, and AD as long as it has a (001) orientation.

Figure 1B:
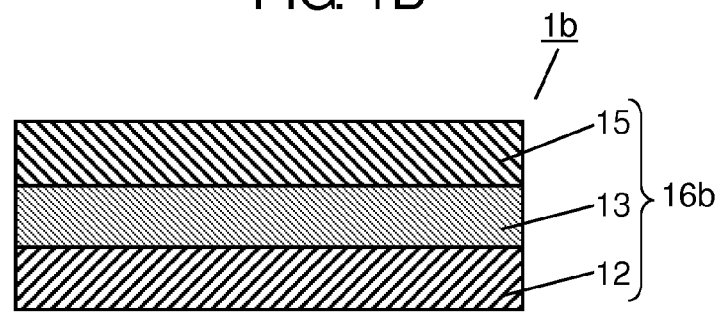
FIG. 1B is a cross-sectional view schematically showing another example of the piezoelectric film of the present invention.

FIG. 1B shows another embodiment of the piezoelectric film according to the present invention. A piezoelectric film 1b shown in FIG. 1B has a multilayer structure 16b. The multilayer structure 16b is a structure in which the multilayer structure 16a shown in FIG. 1A further includes a metal electrode layer 12. In the multilayer structure 16b, the first electrode 13 is formed on this metal electrode layer 12. Particularly, the multilayer structure 16b has the metal electrode layer 12, the first electrode 13 having a (001) orientation, and the $(Na_xBi_y)TiO_{0.5x+1.5y+2}$—$BaTiO_3$ layer 15 having a (001) orientation, in this order. These layers are laminated in contact with each other.

An example of the material for the metal electrode layer 12 is metal such as platinum (Pt), palladium (Pd), or gold (Au); conductive oxide such as nickel oxide (NiO), ruthenium oxide ($RuO_2$), iridium oxide ($IrO_2$), or strontium ruthenate ($SrRuO_3$). The metal electrode layer 12 can be made of two or more these materials. Preferably, the metal electrode layer 12 has a low electrical resistance and a high heat resistance. Therefore, it is preferred that the metal electrode layer 12 is a Pt layer. The Pt layer may have a (111) orientation.

In other words, the piezoelectric film according to the present invention may further comprise a Pt layer. The first electrode 13 may be formed on the Pt layer.

The metal electrode layer 12 can serve as an electrode layer for applying a voltage the $(Na_xBi_y)TiO_{0.5x+1.5y+2}$—$BaTiO_3$ layer 15, which is a piezoelectric layer, together with the first electrode 13. In other words, the electrode layer is a laminate composed of the first electrode 13 and the metal electrode layer 12.

The piezoelectric film 1b shown in FIG. 1B can be manufactured by forming the first electrode 13, and the $(Na_xBi_y)TiO_{0.5x+1.5y+2}$—$BaTiO_3$ layer 15 on the metal electrode layer 12 in this order.

According to the piezoelectric film manufacturing method of the present invention, the first electrode 13 may be formed on the metal electrode layer 12 (preferably, the Pt layer). Thus, the piezoelectric film 1b shown in FIG. 1B can be manufactured.

Figure 1C:
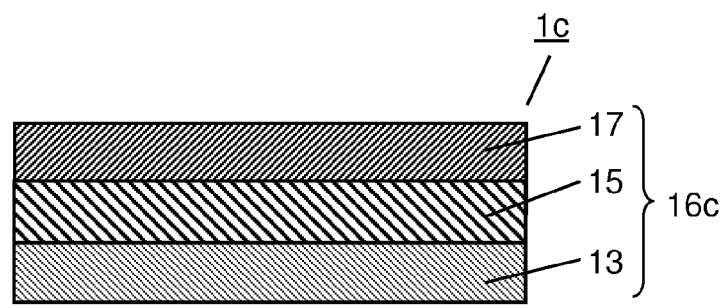
FIG. 1C is a cross-sectional view schematically showing still another example of the piezoelectric film of the present invention.

FIG. 1C shows still another embodiment of the piezoelectric film according to the present invention. A piezoelectric film 1c shown in FIG. 1C has a multilayer structure 16c. The multilayer structure 16c is a structure in which the multilayer structure 16a shown in FIG. 1A further includes a second electrode 17. The second electrode 17 is formed on the $(Na_xBi_y)TiO_{0.5x+1.5y+2}$—$BaTiO_3$ layer 15. Particularly, the multilayer structure 16c has the first electrode 13 having a (001) orientation, the $(Na_xBi_y)TiO_{0.5x+1.5y+2}$—$BaTiO_3$ layer 15 having a (001) orientation, and the second electrode 17 in this order. These layers are laminated in contact with each other.

In the piezoelectric film 1c, the $(Na_xBi_y)TiO_{0.5x+1.5y+2}$—$BaTiO_3$ layer 15 is interposed between the first electrode 13 and the second electrode 17. The first electrode 13 and the second electrode 17 can serve as an electrode layer for applying a voltage to the $(Na_xBi_y)TiO_{0.5x+1.5y+2}$—$BaTiO_3$ layer 15, which is a piezoelectric layer.

The second electrode 17 is made of a conductive material. An example of the material is a metal having low electrical resistance. The material may be a conductive oxide such as NiO, $RuO_2$, $IrO_3$, $SrRuO_3$, or $LaNiO_3$. The second electrode 17 may be composed of two or more these materials. An adhesive layer improving an adhesion between the second electrode 17 and the $(Na_xBi_y)TiO_{0.5x+1.5y+2}$—$BaTiO_3$ layer 15 may be provided therebetween. An example of the material of the adhesive layer is titanium (Ti). The material may be tantalum (Ta), iron (Fe), cobalt (Co), nickel (Ni), chrome (Cr), or a compound thereof. The adhesive layer may be composed of two or more these materials. The adhesive layer may be omitted depending on the adhesion between the second electrode 17 and the $(Na_xBi_y)TiO_{0.5x+1.5y+2}$—$BaTiO_3$ layer 15.

The piezoelectric film 1c shown in FIG. 1C can be manufactured by forming the $(Na_xBi_y)TiO_{0.5x+1.5y+2}$—$BaTiO_3$ layer 15 and the second electrode 17 on the first electrode 13 in this order. The second electrode 17 can be formed by thin film formation techniques such as sputtering, PLD, CVD, sol-gel processing, and AD.

The present method of fabricating a piezoelectric film may further comprise a step of forming the second electrode 17 on the $(Na_xBi_y)TiO_{0.5x+1.5y+2}$—$BaTiO_3$ layer 15. Thus, the piezoelectric film 1c shown in FIG. 1C can be fabricated.

Figure 1D:
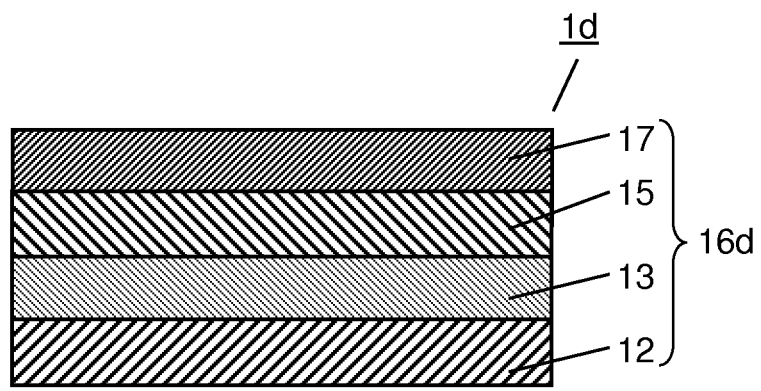
FIG. 1D is a cross-sectional view schematically showing further still another example of the piezoelectric film of the present invention.

FIG. 1D shows further still another example of the piezoelectric film of the present invention. A piezoelectric film 1d shown in FIG. 1D has a multilayer structure 16d. The multilayer structure 16d is a structure in which the multilayer structure 16a shown in FIG. 1A further includes the metal electrode layer 12 and the second electrode 17. In the multilayer structure 16d, the first electrode 13 is formed on the metal electrode layer 12. The second electrode 17 is formed on the $(Na_xBi_y)TiO_{0.5x+1.5y+2}$—$BaTiO_3$ layer 15. Particularly, the multilayer structure 16d has the metal electrode layer 12, the first electrode 13 having a (001) orientation, the $(Na_xBi_y)TiO_{0.5x+1.5y+2}$—$BaTiO_3$ layer 15 having a (001) orientation, and the second electrode 17 in this order. These layers are laminated in contact with each other.

The metal electrode layer 12 of the piezoelectric film 1d can serve as an electrode layer for applying a voltage to the $(Na_xBi_y)TiO_{0.5x+1.5y+2}$—$BaTiO_3$ layer 15, which is a piezoelectric layer, together with the first electrode 13. In other words, the electrode layer is a laminate of the first electrode 13 and the metal electrode layer 12. Furthermore, in the piezoelectric thin film 1d, the $(Na_xBi_y)TiO_{0.5x+1.5y+2}$—$BaTiO_3$ layer 15 is interposed between the first electrode 13 (or the electrode layer comprising the first electrode 13) and the second electrode 17. The first electrode 13 (or the electrode layer comprising the first electrode 13) and the second electrode 17 can serve as an electrode layer for applying a voltage to the $(Na_xBi_y)TiO_{0.5x+1.5y+2}$—$BaTiO_3$ layer 15, which is a piezoelectric layer.

The piezoelectric film 16d shown in FIG. 1D can be manufactured by forming the first electrode 13, the $(Na_xBi_y)TiO_{0.5x+1.5y+2}$—$BaTiO_3$ layer 15, the second electrode 17 on the metal electrode layer 12 in this order.

The present method of fabricating a piezoelectric film may comprise a step of forming the first electrode 13 on the metal electrode layer 12 (preferably, a Pt layer). Furthermore, the method may further comprise a step of forming the second electrode 17 on the $(Na_xBi_y)TiO_{0.5x+1.5y+2}$—$BaTiO_3$ layer 15. Thus, the piezoelectric film 1d shown in FIG. 1D can be fabricated.

Figure 1E:
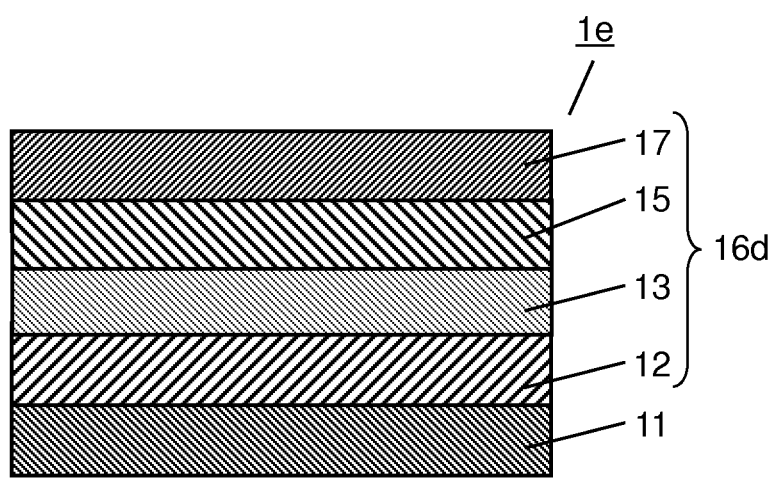
FIG. 1E is a cross-sectional view schematically showing further still another example of the piezoelectric film of the present invention.

The piezoelectric film according to the present invention may further comprise a substrate 11 as shown in FIG. 1E.

In the piezoelectric film 1e shown in FIG. 1E, the multilayer structure 16d shown in FIG. 1D is formed on the substrate 11.

The substrate 11 may be a silicon substrate. A Si monocrystalline substrate is preferred.

An adhesive layer improving an adhesion between the substrate 11 and the multilayer structure 16d (more particularly, between the substrate 11 and the first electrode 13) may be provided therebetween. However, the adhesive layer is required to be conductive. An example of the material of the adhesive layer is titanium (Ti). The material may be tantalum (Ta), iron (Fe), cobalt (Co), nickel (Ni), chrome (Cr), or a compound thereof. The adhesive layer may be composed of two or more these materials. The adhesive layer may be omitted depending on the adhesion between the substrate 11 and the multilayer structure 16d.

The piezoelectric film 1e shown in FIG. 1E can be fabricated by forming the metal electrode layer 12 (preferably, a Pt layer), the first electrode 13, the $(Na_xBi_y)TiO_{0.5x+1.5y+2}$—$BaTiO_3$ layer 15, and the second electrode 17 on the substrate 11 in this order.

The present method of fabricating the piezoelectric film may comprise a step of forming the first electrode 13 on the substrate 11.

The piezoelectric films 1a to 1d shown in FIGS. 1A to 1D may be fabricated with use of a base substrate. Particularly, one of the multilayer structures 16a to 16d may be formed on the base substrate to remove the base substrate. Thus, the piezoelectric films 1a to 1d may be fabricated. The base substrate may be removed by a known method such as etching.

The piezoelectric film 1e shown in FIG. 1E may be also fabricated with use of a base substrate. In one specific embodiment, the base substrate doubles as the substrate 11. After the multilayer structure 16d may be formed on the base substrate, the base substrate is removed. Subsequently, the multilayer structure 16d may be disposed on the substrate 11 which is prepared separately. Thus, the piezoelectric film 1e may be fabricated.

The base substrate has a smaller thermal expansion coefficient than the $(Na_xBi_y)TiO_{0.5x+1.5y+2}$—$BaTiO_3$ layer 15. An example of the base substrate is a Si substrate, a glass substrate, or a ceramics substrate. The base substrate can be formed by stacking an oxide layer having a sodium-chloride-like crystal structure on the surface of the glass substrate or the ceramics substrate. In this case, the metal electrode layer 12 or the first electrode 13 can be formed on the surface of the oxide layer. An example of the oxide layer is a MgO layer, a NiO layer, or a cobalt oxide (CoO) layer.

As described above, the present method of the fabricating the piezoelectric film may comprise a step of forming the first electrode 13 on the base substrate directly or via another layer such as the metal electrode layer 12. After the base substrate which doubles as the substrate 11 is removed, different substrate may be disposed. In this case, the different substrate may be disposed so that the different substrate is in contact with the metal electrode layer 12 or the first electrode 13. The different substrate may be disposed so that the different substrate is in contact with the $(Na_xBi_y)TiO_{0.5x+1.5y+2}$—$BaTiO_3$ layer 15. In the latter case, a piezoelectric film where the $(Na_xBi_y)TiO_{0.5x+1.5y+2}$—$BaTiO_3$ layer 15, and the first electrode 13 are stacked on the different substrate in this order is obtained.

[Ink Jet Head]

An ink jet head of the present invention will be described below with reference to FIG. 2 to FIG. 4.

Figure 2:
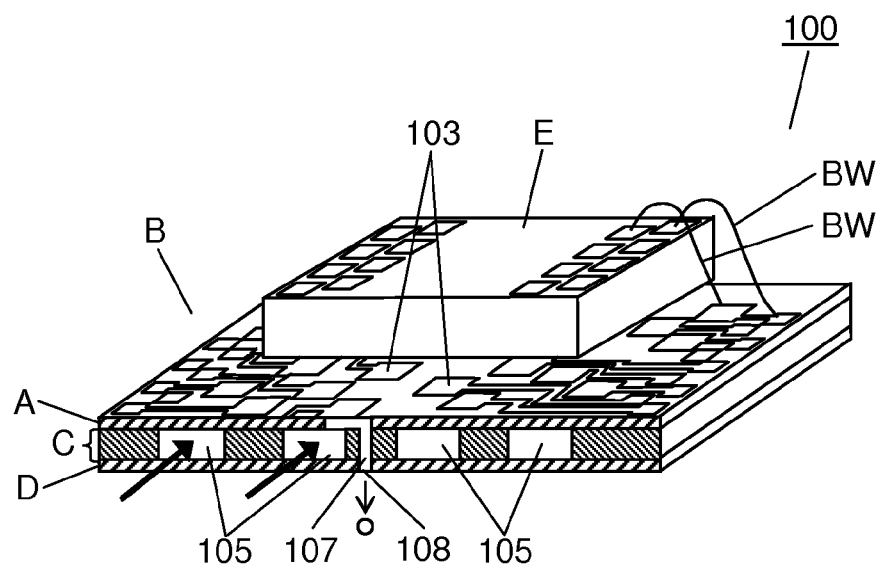
FIG. 2 is a perspective view schematically showing an example of an ink jet head of the present invention and partially showing a cross section of the ink jet head.

FIG. 2 shows one embodiment of the ink jet head of the present invention. FIG. 3 is an exploded view showing main parts including a pressure chamber member and an actuator part in an ink jet head 100 shown in FIG. 2.

Figure 3:
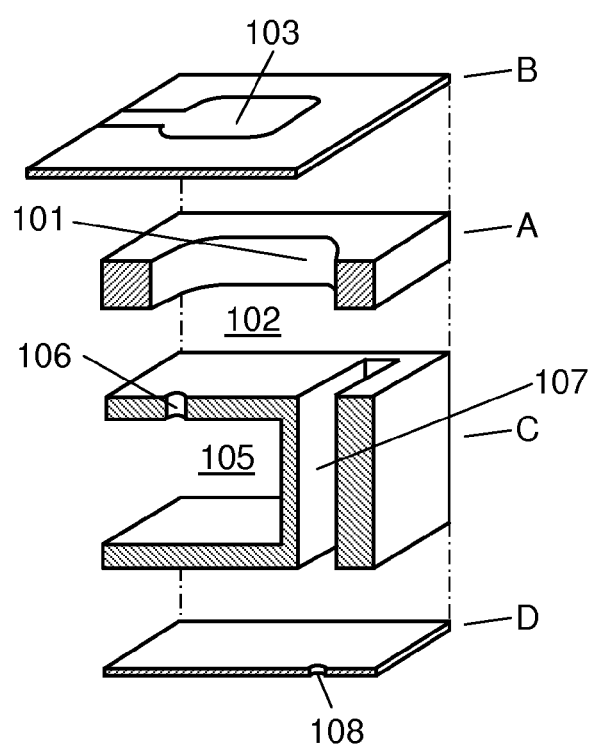
FIG. 3 is an exploded perspective view schematically showing main parts including a pressure chamber member and an actuator part in the ink jet head shown in FIG. 2 and partially showing a cross section of the main parts.

A reference character A in FIG. 2 and FIG. 3 indicates a pressure chamber member. The pressure chamber member A includes through-holes 101 that penetrate therethrough in its thickness direction (in the upward and downward directions in these diagrams). The through-hole 101 shown in FIG. 3 is a part of the through-hole 101 in the cross section in the thickness direction of the pressure chamber member A. A reference character B indicates an actuator part including piezoelectric films and vibration layers. A reference character C indicates an ink passage member C including common liquid chambers 105 and ink passages 107. The pressure chamber member A, the actuator part B, and the ink passage member C are bonded to each other so that the pressure chamber member A is sandwiched between the actuator part B and the ink passage member C. When the pressure chamber member A, the actuator part B, and the ink passage member C are bonded to each other, each of the through-holes 101 forms a pressure chamber 102 for storing ink supplied from the common liquid chamber 105.

The actuator part B has piezoelectric films and vibration layers that are aligned over the corresponding pressure chambers 102 respectively in plan view. In FIG. 2 and FIG. 3, a reference numeral 103 indicates an individual electrode layer that is a part of the piezoelectric film. As shown in FIG. 2, in the ink jet head 100, a plurality of individual electrode layers 103, that is, piezoelectric films are arranged in a zigzag pattern in plan view.

The ink passage member C has a plurality of common liquid chambers 105 arranged in stripes in plan view. In FIG. 2 and FIG. 3, each of the common liquid chambers 105 is aligned over a plurality of pressure chambers 102 in plan view. The common liquid chambers 105 extend in the ink supply direction (in the direction indicated by arrows in FIG. 2) in the ink jet head 100. The ink passage member C has supply ports 106, each of which supplies the ink in the common liquid chamber 105 to one of the pressure chambers 102, and ink passages 107, each of which ejects the ink in the corresponding pressure chamber 102 through the corresponding nozzle hole 108. Usually, one pressure chamber 102 has one supply port 106 and one nozzle hole 108. The nozzle holes 108 are formed in a nozzle plate D. The nozzle plate D is bonded to the ink passage member C so that the nozzle plate D and the pressure chamber member A sandwich the ink passage member C therebetween.

In FIG. 2, a reference character E indicates an IC chip. The IC chip E is connected electrically to the individual electrode layers 103, which are exposed on the surface of the actuator part B, through bonding wires BW. For simplicity of FIG. 2, only a part of the bonding wires BW are shown in FIG. 2.

FIG. 3 shows the configuration of the main parts including the pressure chamber member A and the actuator part B. FIG. 4 shows the cross section perpendicular to the ink supply direction (in the direction indicated by the arrows in FIG. 2) in the pressure chamber member A and the actuator part B. The actuator part B includes piezoelectric films 104 (104a to 104d) each having the piezoelectric layer 15 sandwiched between the first electrode (the individual electrode layer 103) and the second electrode (the common electrode layer 112). The individual electrode layers 103 correspond one to one to the piezoelectric films 104a to 104d. The common electrode layer 112 is a single layer electrode that is common to the piezoelectric films 104a to 104d.

Figure 4:
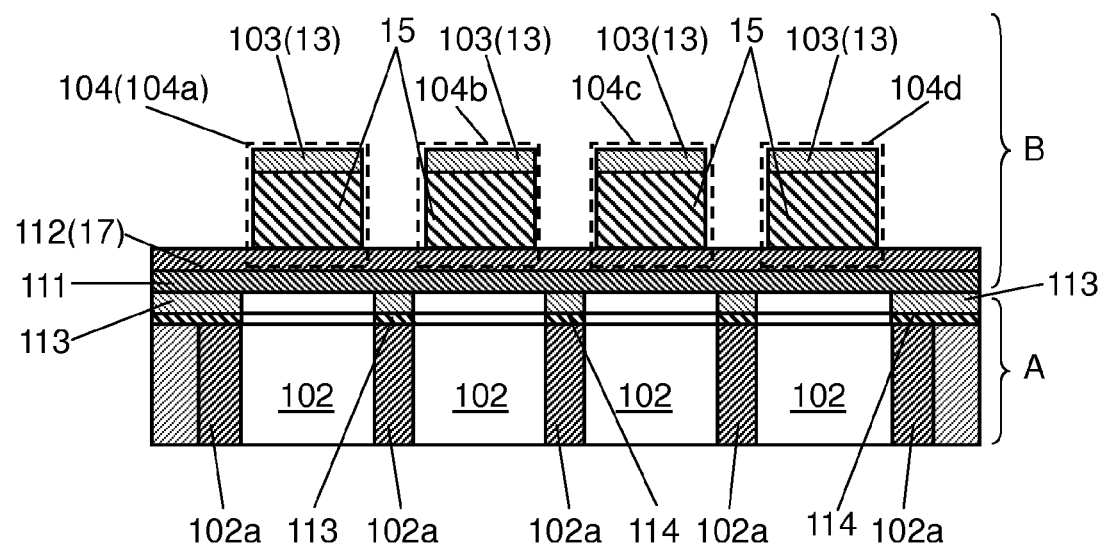
FIG. 4 is a cross-sectional view schematically showing an example of the main parts including the pressure chamber member and the actuator part in the ink jet head shown in FIG. 2.

As surrounded by the dashed-line in FIG. 4, the above-mentioned piezoelectric films 104 are arranged in the ink jet head. The piezoelectric film is the piezoelectric film described in the item titled as "Piezoelectric film".

Though not indicated in FIG. 4, as described in FIG. 1B, 1D, 1E, the metal electrode layer 12 can be included.

[Image Forming Method by Ink Jet Head]

The image forming method of the present invention includes, in the above-described ink jet head of the present invention, a step of applying a voltage to the piezoelectric layer through the first and second electrodes (that is, the individual electrode layer and the common electrode layer) to displace, based on the piezoelectric effect, the vibration layer in its film thickness direction so that the volumetric capacity of the pressure chamber changes; and a step of ejecting the ink from the pressure chamber by the displacement.

The voltage to be applied to the piezoelectric layer is changed with the relative position between the ink jet head and an object like a sheet of paper, on which an image is to be formed, being changed, so as to control the timing of ink ejection from the ink jet head and the amount of ink ejected therefrom. As a result, an image is formed on the surface of the object. The term "image" used in the present description includes a character. In other words, according to the present method for forming an image, a letter, a picture, or a figure is printed to a print target such as a sheet of paper. With this method, a picturesque image can be printed.

[Angular Velocity Sensor]

Figure 5:
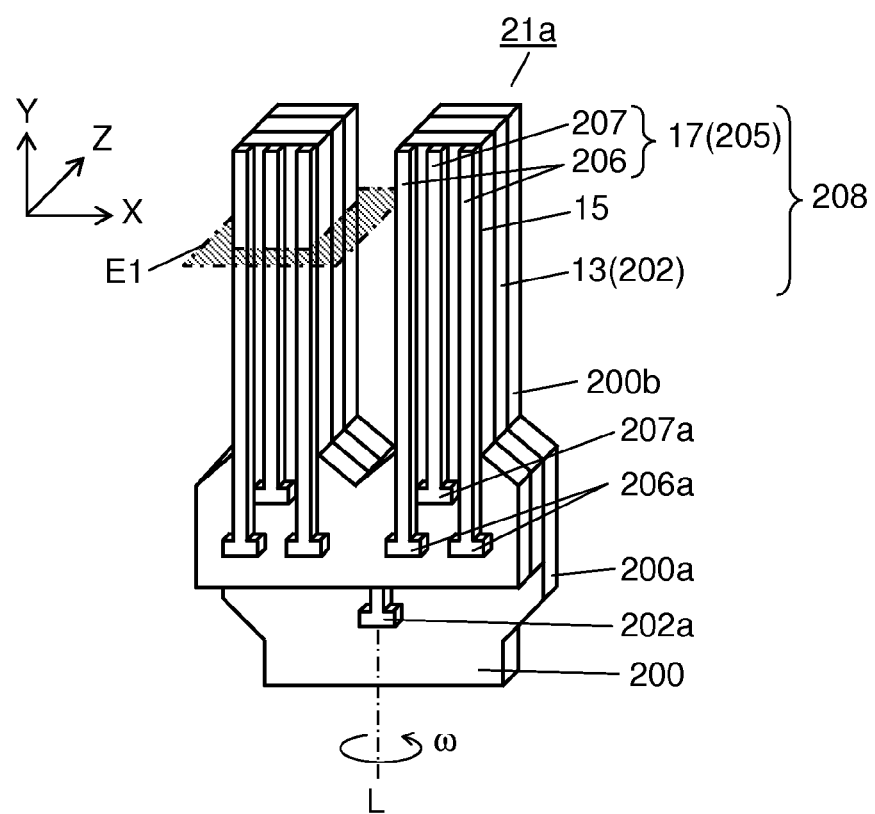
FIG. 5 is a perspective view schematically showing an example of an angular velocity sensor of the present invention.
Figure 6:
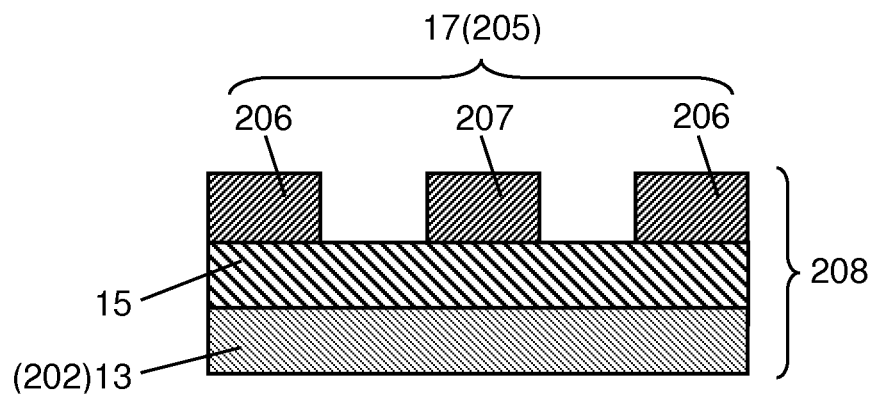
FIG. 6 is a cross-sectional view showing a cross section E1 of the angular velocity sensor shown in FIG. 5.

FIG. 5 shows examples of an angular velocity sensor of the present invention. FIG. 6 shows a cross section E1 of an angular velocity sensor 21a shown in FIG. 5. The angular velocity sensor 21a shown in FIG. 5 is a so-called tuning-fork type angular velocity sensor. This type of angular velocity sensor can be used in a navigation apparatus for a vehicle, and as a sensor for correcting image blurring due to hand movement in a digital still camera.

The angular velocity sensor 21a shown in FIG. 5 includes a substrate 200 having vibration parts 200b and piezoelectric films 208 bonded to the vibration parts 200b.

The substrate 200 has a stationary part 200a and a pair of arms (vibration parts 200b) extending in a predetermined direction from the stationary part 200a. The direction in which the vibration parts 200b extend is the same as the direction in which the central axis of rotation L of the angular velocity detected by the angular velocity sensor 21 extends. Particularly, it is the Y direction in FIG. 5. The substrate 200 has a shape of a tuning fork including two arms (vibration parts 200b), when viewed from the thickness direction of the substrate 200 (the Z direction in FIG. 5).

The material of the substrate 200 is not limited. The material is, for example, Si, glass, ceramic, or metal. A monocrystalline Si substrate can be used as the substrate 200. The thickness of the substrate 200 is not limited as long as the functions of the angular velocity sensor 21a can develop. More particularly, the substrate 200 has a thickness of at least 0.1 mm but not more than 0.8 mm. The thickness of the stationary part 200a can be different from that of the vibration part 200b.

The piezoelectric film 208 is bonded to the vibration part 200b. The piezoelectric film 208 is the piezoelectric film described in the item titled as "Piezoelectric film". As shown in FIG. 5 and FIG. 6, the piezoelectric film 208 comprises the first electrode 13 (202), the piezoelectric layer 15, and the second electrode 17 (205).

The second electrode 205 has an electrode group including a drive electrode 206 and a sense electrode 207. The drive electrode 206 applies a driving voltage that oscillates the vibration part 200b to the piezoelectric layer 15. The sense electrode 207 measures a deformation of the vibration part 200b caused by an angular velocity applied to the vibration part 200b. That is, the vibration part 200b usually oscillates in the width direction thereof (the X direction in FIG. 5). More particularly, in the angular velocity sensor shown in FIG. 5, a pair of drive electrodes 206 are provided on both of the width-direction edge portions of the vibration part 200b along the length direction thereof (the Y direction in FIG. 5). Only one drive electrode 206 may be provided on one of the width-direction edge portions of the vibration part 200b. In the angular velocity sensor shown in FIG. 5, the sense electrode 207 is provided along the length direction of the vibration part 200b and sandwiched between the pair of drive electrodes 206. A plurality of sense electrodes 207 may be provided on the vibration part 200b. The deformation of the vibration part 200b measured by the sense electrode 207 usually is a deflection in the thickness direction thereof (the Z direction in FIG. 5).

In the angular velocity sensor of the present invention, one of the first electrode and the second electrode selected therefrom can be composed of an electrode group including the drive electrode and the sense electrode. In the angular velocity sensor 21a shown in FIG. 5, the second electrode 205 is composed of the electrode group. Unlike this angular velocity sensor, the first electrode 202 can be composed of the electrode group.

The first electrode 202, the drive electrode 206, and the sense electrode 207 have connection terminals 202a, 206a, and 207a, respectively, formed at the end portions thereof. The shape and position of each of the connection terminals are not limited. In FIG. 5, the connection terminals are provided on the stationary part 200a.

In the angular velocity sensor shown in FIG. 5, the piezoelectric film 208 is bonded to both the vibration part 200b and the stationary part 200a. The bonding state of the piezoelectric film 208 is not limited as long as the piezoelectric film 208 can oscillate the vibration part 200b and measure the deformation of the vibration part 200b. For example, the piezoelectric film 208 may be bonded only to the vibration part 200b.

The angular velocity sensor of the present invention may have two or more vibration part groups each consisting of a pair of vibration parts 200b. Such an angular velocity sensor can serve as a biaxial or triaxial angular velocity sensor capable of measuring angular velocities with respect to a plurality central axes of rotation. The angular velocity sensor shown in FIG. 5 has one vibration part group consisting of a pair of vibration parts 200b.

[Method of Measuring Angular Velocity by Angular Velocity Sensor]

The angular velocity measuring method of the present invention uses the angular velocity sensor of the present invention, and includes the steps of: applying a driving voltage to the piezoelectric layer to oscillate the vibration part of the substrate; and measuring a deformation of the vibration part caused by an angular velocity applied to the oscillating vibration part to obtain a value of the applied angular velocity. The driving voltage is applied between the drive electrode and one of the first electrode and the second electrode (the other electrode) that serves neither as the drive electrode nor as the sense electrode, and thus the driving voltage is applied to the piezoelectric layer. The sense electrode and the other electrode measure the deformation of the oscillating vibration part caused by the angular velocity.

Hereinafter, the angular velocity measuring method by the angular velocity sensor 21a shown in FIG. 5 is described. A driving voltage having a frequency that resonates with the natural vibration of the vibration part 200b is applied to the piezoelectric layer 15 through the first electrode 202 and the drive electrode 206 so as to oscillate the vibration part 200b. The driving voltage can be applied, for example, by grounding the first electrode 202 and changing the potential of the driving electrode 206 (in other words, the driving voltage is the potential difference between the first electrode 202 and the driving electrode 206). The angular velocity sensor 21a includes a pair of vibration parts 200b that are arranged in the form of the tuning fork. Usually, reverse (positive and negative) voltages are applied to the drive electrodes 206 provided on the respective vibration parts 200b of the pair. This allows the respective vibration parts 200b to oscillate in the mode in which they vibrate in the directions opposite to each other (the mode in which they vibrate symmetrically with respect to the central axis of rotation L shown in FIG. 5). In the angular velocity sensors 21a shown in FIG. 5, the vibration parts 200b oscillate in their width direction (the X direction). The angular velocity can be measured by oscillating only one of the pair of vibration parts 200b. For accurate measurement, however, it is preferable to oscillate both of the vibration parts 200b in the mode in which they vibrate in the directions opposite to each other.

When an angular velocity ω with respect to the central axis of rotation L is applied to the angular velocity sensor 21a in which the vibration parts 200b are oscillating, the vibration parts 200b are deflected respectively in their thickness direction (the Z direction) by Coriolis force. In the case where the respective vibration parts 200b are oscillating in the mode in which they vibrate in the directions opposite to each other, they are deflected in the opposite directions by the same degree. The piezoelectric layer 15 bonded to the vibration part 200b is also deflected according to this deflection of the vibration part 200b. As a result, a potential difference is generated between the first electrode 202 and the sense electrode 207 in accordance with the deflection of the piezoelectric layer 15, that is, the magnitude of the generated Coriolis force. The angular velocity c applied to the angular velocity sensor 21a can be measured by measuring the magnitude of the potential difference.

The following relationship between a Coriolis force Fc and an angular velocity ω is true:

$$Fc = 2mv\omega$$

where v is the velocity of the oscillating vibration part 200b in the oscillation direction, and m is the mass of the vibration part 200b. As shown in this equation, the angular velocity ω can be calculated from the Coriolis force Fc.

[Piezoelectric Generating Element]

Figure 7:
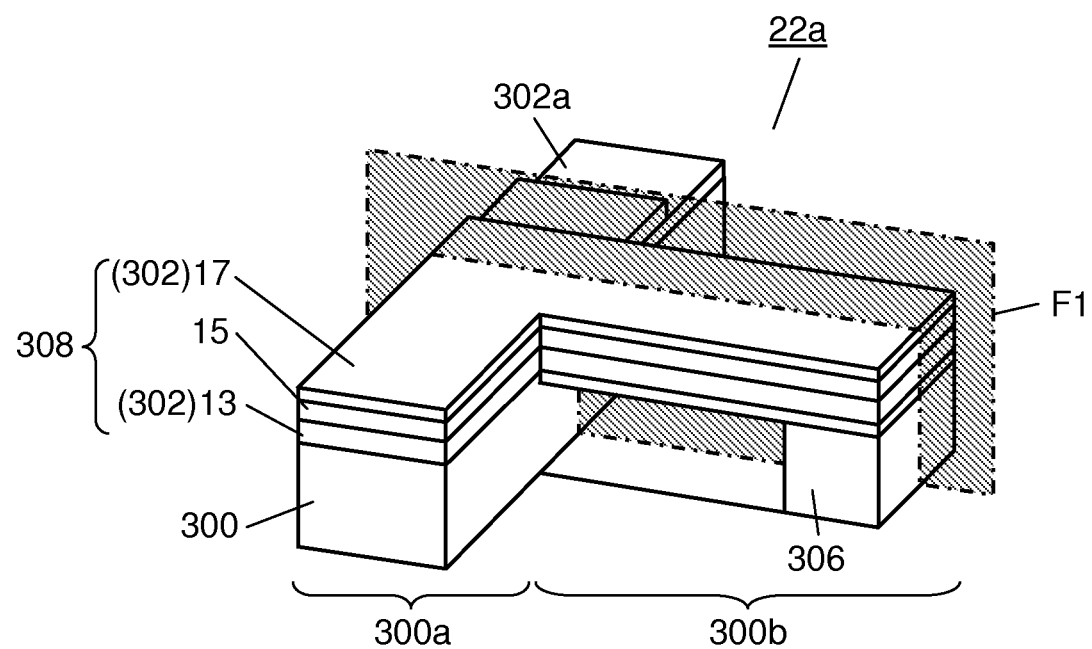
FIG. 7 is a perspective view schematically showing an example of a piezoelectric generating element of the present invention.
Figure 8:
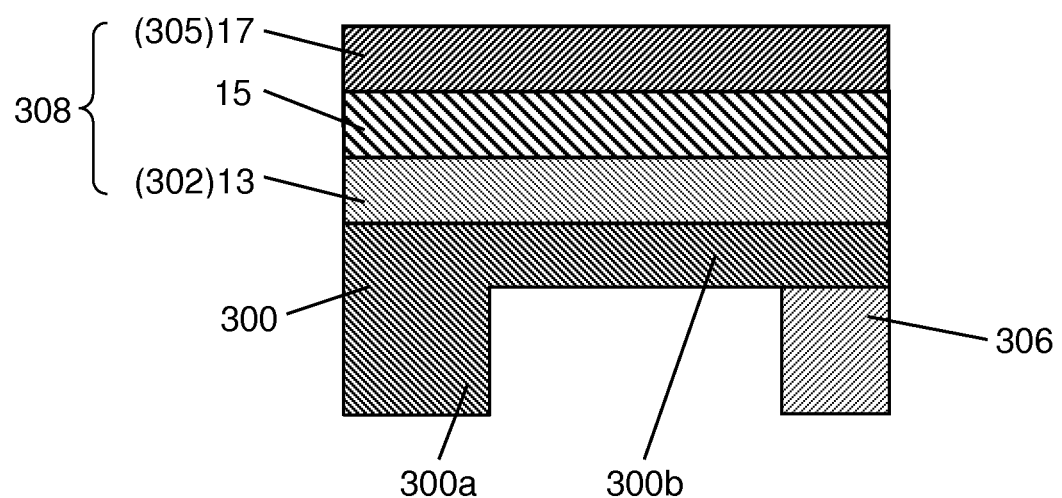
FIG. 8 is a cross-sectional view showing a cross section F1 of the piezoelectric generating element shown in FIG. 7.

FIG. 7 shows an example of the piezoelectric generating element of the present invention. FIG. 8 shows a cross section F1 of a piezoelectric generating element 22a shown in FIG. 7. The piezoelectric generating elements 22a are elements that convert externally-applied mechanical vibration into electrical energy. The piezoelectric generating elements 22a are applied suitably to a self-sustained power supply for generating electric power from various vibrations including engine vibrations and driving vibrations generated in vehicles and machines, and vibrations generated during walking.

The piezoelectric generating element 22a shown in FIG. 7 includes a substrate 300 having a vibration part 300b and a piezoelectric film 308 bonded to the vibration part 300b.

The substrate 300 has a stationary part 300a, and a vibration part 300b having a beam extending in a predetermined direction from the stationary part 300a. The material of the stationary part 300a can be the same as the material of the vibration part 300b. These materials may, however, be different from each other. The stationary part 300a and the vibration part 300b made of materials different from each other may be bonded to each other.

The material of the substrate 300 is not limited. The material is, for example, Si, glass, ceramic, or metal. A monocrystalline Si substrate can be used as the substrate 300. The substrate 300 has a thickness of, for example, at least 0.1 mm but not more than 0.8 mm. The stationary part 300a may have a thickness different from that of the vibration part 300b. The thickness of the vibration part 300b can be adjusted for efficient power generation by changing the resonance frequency of the vibration part 300b.

A weight load 306 is bonded to the vibration part 300b. The weight load 306 adjusts the resonance frequency of the vibration part 300b. The weight load 306 is, for example, a vapor-deposited thin film of Ni. The material, shape, and mass of the weight load 306, as well as the position to which the weight load 306 is bonded can be adjusted according to a desired resonance frequency of the vibration part 300b. The weight load 306 may be omitted. The weight load 306 is not necessary when the resonance frequency of the vibration part 300b is not adjusted.

The piezoelectric film 308 is bonded to the vibration part 300b. The piezoelectric film 308 is the piezoelectric film described in the item titled as "Piezoelectric film". As shown in FIG. 7 and FIG. 8, the piezoelectric film 308 comprises the first electrode 13 (302), the piezoelectric layer 15, the second electrode 17 (305).

In the piezoelectric generating elements shown in FIG. 7, a part of the first electrode 302 is exposed. This part can serve as a connection terminal 302a.

In the piezoelectric generating element shown in FIG. 7, the piezoelectric film 308 can be bonded to both of the vibration part 300b and the stationary part 300a. The piezoelectric film 308 can be bonded only to the vibration part 300b.

When the piezoelectric generating element of the present invention has a plurality of vibration parts 300b, an increased amount of electric power can be generated. Such a piezoelectric generating element can be applied to mechanical vibrations containing a wide range of frequency components if the plurality of vibration parts 300b have different resonance frequencies.

[Method of Generating Electric Power Using Piezoelectric Generating Element]

The above-described piezoelectric generating element of the present invention is vibrated to obtain electric power through the first electrode and the second electrode.

When mechanical vibration is applied externally to the piezoelectric generating element 22a, the vibration part 300b starts vibrating to produce vertical deflection with respect to the stationary part 300a. The piezoelectric effect produced by this vibration generates an electromotive force across the piezoelectric layer 15. As a result, a potential difference is generated between the first electrode 302 and the second electrode 305 that sandwich the piezoelectric layer 15 therebetween. The higher piezoelectric performance of the piezoelectric layer 15 generates a larger potential difference between the first and second electrodes. Particularly in the case where the resonance frequency of the vibration part 300b is close to the frequency of mechanical vibration to be applied externally to the element, the amplitude of the vibration part 300b increases and thus the electric power generation characteristics are improved. Therefore, the weight load 306 is preferably used to adjust the resonance frequency of the vibration part 300b to be close to the frequency of mechanical vibration applied externally to the element.

EXAMPLES

Hereinafter, the present invention is described in more detail with reference to examples. The present invention is not limited to the following examples. To fabricate the comprehension of the description, comparative examples 1-2 are described first.

Comparative Example 1

The piezoelectric film according to the comparative example 1 comprised a Si (100) substrate, a Pt (111) layer, and a $(Na_xBi_y)TiO_{0.5x+1.5y+2}$—$BaTiO_3$ layer (x=0.50, y=0.50) in this order.

The fabrication method and the evaluation method of the piezoelectric film are described in more detail in the example 1, which is described later. The fabrication method and the evaluation method of the piezoelectric film according to the comparative example 1 were identical to these of the example 1 except that the $LaNiO_3$ layer was not formed and that x=0.50 and y=0.50.

From the result of the X-ray diffraction (FIG. 9), the reflection peak derived from the $(Na_xBi_y)TiO_{0.5x+1.5y+2}$—$BaTiO_3$ layer 15 was observed except for the reflection peaks derived from the Si substrate and the Pt layer. However, the (001) reflection peak was only 193 cps, which was less than half of the (110) reflection peak of 609 cps.

The comparative example 1 means that a film single-oriented only to a (001) orientation was not obtained when the $(Na_xBi_y)TiO_{0.5x+1.5y+2}$—$BaTiO_3$ layer was formed on the laminate composed of the Si (100) substrate/the Pt (111) layer.

Comparative Example 2

The piezoelectric film according to the comparative example 2 comprised a Si (100) substrate, a Pt (111) layer, a $LaNiO_3$ (001) layer, and a $(Na_xBi_y)TiO_{0.5x+1.5y+2}$—$BaTiO_3$ layer (x=0.50, y=0.50) in this order.

The fabrication method and the evaluation method of the piezoelectric film are described in more detail in the example 1, which is described later. An identical experiment to that of the example 1 was performed except that the composition of the piezoelectric film was x=0.50 and y=0.50. The fabrication method and the evaluation method of the piezoelectric film according to the comparative example 2 were identical to these of the comparative example 1 except that the $LaNiO_3$ (001) layer was formed.

From the result of the X-ray diffraction (FIG. 9), the reflection peak derived from the $(Na_xBi_y)TiO_{0.5x+1.5y+2}$—$BaTiO_3$ layer 15 was observed except for the reflection peaks derived from the Si substrate, the Pt layer, and the $LaNiO_3$ layer. This reflection peak reveals that the formed $(Na_xBi_y)TiO_{0.5x+1.5y+2}$—$BaTiO_3$ layer 15 is oriented to a (001) orientation and a (110) orientation. The (001) peak intensity was 2,661 cps, and the half-value width was 2.9°.

Figure 10:
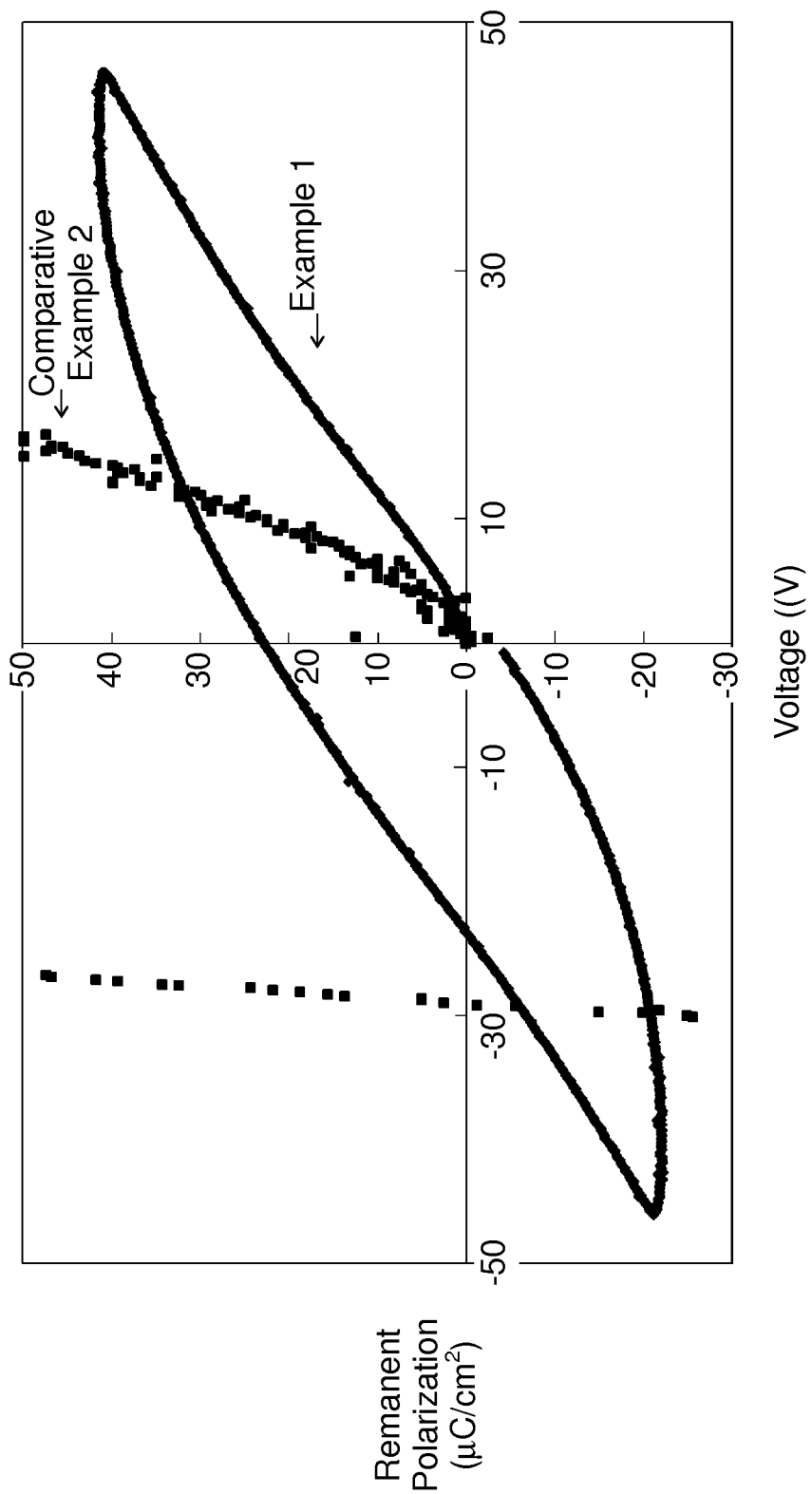
FIG. 10 is a diagram showing P-E hysteresis loops of the piezoelectric films fabricated in the example 1 and the comparative example 2.
Figure 11:
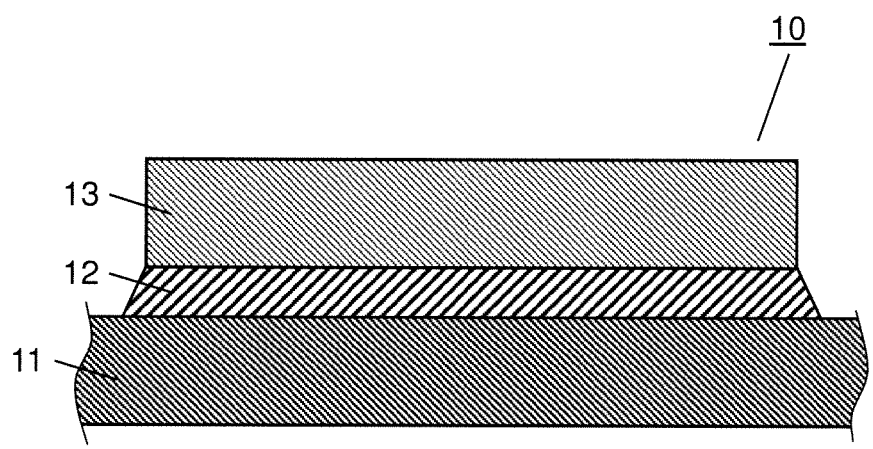
FIG. 11 shows the FIG. 1 in Patent Literature 1.

The piezoelectric film according to the comparative example 2 had a significantly great leak current property (tan δ:40%), and it was difficult to measure an exact P-E hysteresis loop (See FIG. 10). Accordingly, it was difficult to measure a value of an exact piezoelectric constant $d_{31}$ of the piezoelectric film according to the comparative example 2. The presumptive piezoelectric constant $d_{31}$ was approximately −40 pC/N.

The comparative example 2 means that the orientation intensity was greater than that of the comparative example 1, in which the $LaNiO_3$ layer was not formed; however, a film single-oriented only to a (001) orientation was not obtained when the $(Na_xBi_y)TiO_{0.5x+1.5y+2}$—$BaTiO_3$ layer (x=0.50, y=0.50) was formed on the laminate composed of the Si (100) substrate/the Pt (111) layer/the $LaNiO_3$ (001) layer. Furthermore, the piezoelectric film according to the comparative example 2 had a greater leak current property and a significantly low piezoelectric property.

Comparative Example 3

The piezoelectric film according to the comparative example 3 comprised a Si (100) substrate, a Pt (111) layer, a $LaNiO_3$ (001) layer, and a $(Na_xBi_y)TiO_{0.5x+1.5y+2}$—$BaTiO_3$ layer (x=0.29, y=0.43) in this order.

The fabrication method and the evaluation method of the piezoelectric film are described in more detail in the example 1, which is described later. The fabrication method and the evaluation method of the piezoelectric film according to the comparative example 3 were identical to these of the example 1 and the comparative example 2 except that x=0.29 and y=0.43.

From the result of the X-ray diffraction (FIG. 9), the reflection peak derived from the $(Na_xBi_y)TiO_{0.5x+1.5y+2}$—$BaTiO_3$ layer 15 was observed except for the reflection peaks derived from the Si substrate, the Pt layer, and the $LaNiO_3$ layer. This reflection peak reveals that the obtained $(Na_xBi_y)TiO_{0.5x+1.5y+2}$—$BaTiO_3$ layer 15 is single oriented to only a (001) orientation and a (110) orientation. However, the reflection peak intensity was 2,548 cps. This value was similar to the value of the stoichiometry composition (x=0.50, y=0.50) in the comparative example 2, This means that the effect of the orientation control to a (001) orientation was acknowledged, however that the crystallinity was not improved.

Figure 12:
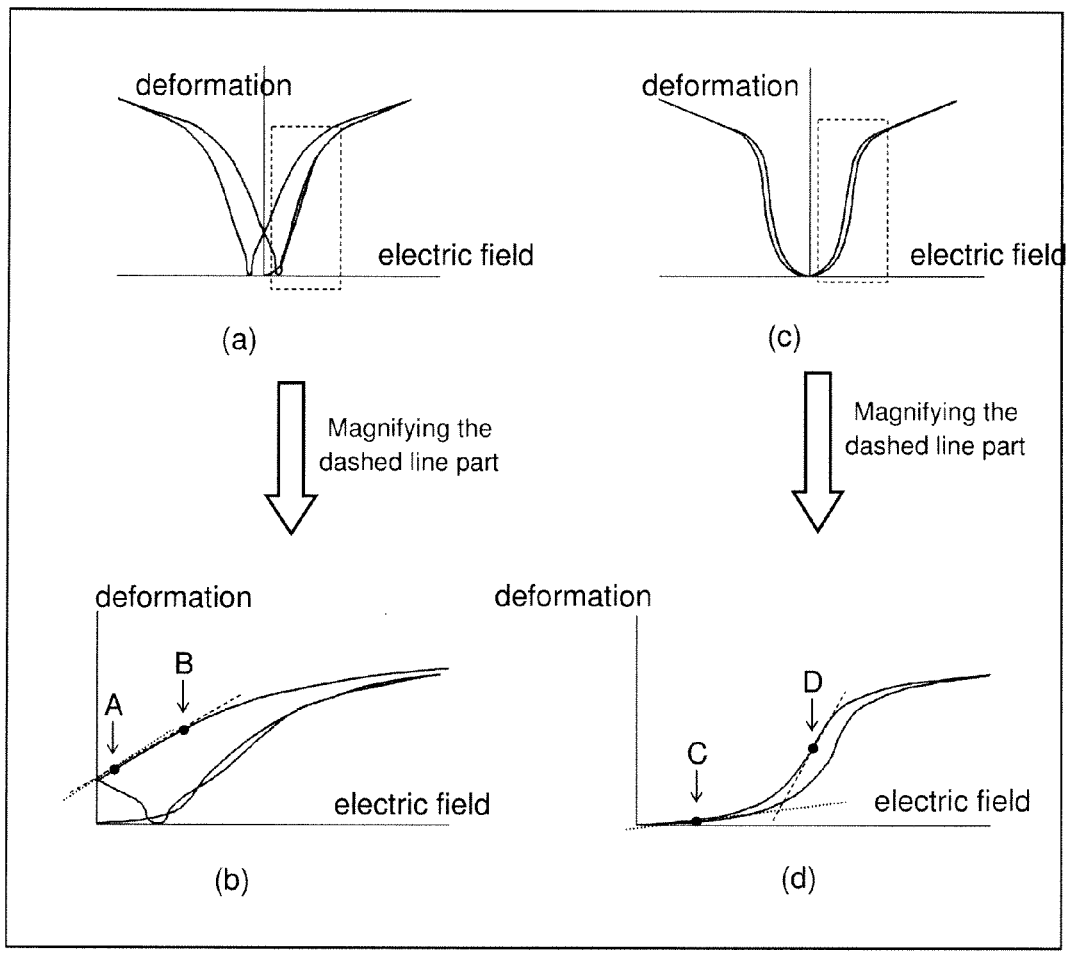
FIG. 12 shows a property of an applied electric field—an amount of a deformation in a piezoelectric film.

The piezoelectric constant $d_{31}$ in the high electric field of 10 volts/micrometer was −56 pC/N. The value of $d_{31}$ (3 volts/micrometer)/$d_{31}$ (10 volts/micrometer) was 0.54. This means that the relationship between the applied electric field and the amount of the deformation lied in the relationship of a quadratic function, as shown in FIG. 12(C) and FIG. 12(D).

The comparative example 3 means that the $(Na_xBi_y)TiO_{0.5x+1.5y+2}$—$BaTiO_3$ layer is oriented only to a (001) orientation when the piezoelectric film formed on the laminate composed of the Si (100) substrate/the Pt (111) layer/the $LaNiO_3$ (001) layer is the $(Na_xBi_y)TiO_{0.5x+1.5y+2}$—$BaTiO_3$ layer (x=0.29, y=0.43). However, the piezoelectric film according to the comparative example 3 had a low piezoelectric constant due to its low crystallinity. The amount of deformation of the piezoelectric film according to the comparative example 3 was not proportional to the applied electric field.

Example 1

In the example 1, a piezoelectric film shown in FIG. 1E was fabricated. The piezoelectric film comprises the substrate 11, the metal electrode layer 12, the $LaNiO_3$ layer 13, the $(Na_xBi_y)TiO_{0.5x+1.5y+2}$—$BaTiO_3$ layer 15 (x=0.37 and y=0.58), and the second electrode 17 in this order. The fabrication procedure is described below.

A Pt layer (with a thickness of 100 nm) having a (111) orientation was formed by RF magnetron sputtering on the surface, having a plane orientation of (100), of a monocrystalline Si substrate. The Pt layer corresponds to the metal electrode layer 12. The Pt layer was formed using a metallic Pt target in an argon (Ar) gas atmosphere under the layer formation conditions of an RF power of 15 W and a substrate temperature of 300 degrees Celsius. To improve the adhesion between the monocrystalline Si substrate and the Pt layer, a Ti layer (with a thickness of 2.5 nm) was formed previously on the surface of the monocrystalline Si substrate before the Pt layer was formed. The Ti layer was formed in the same manner as in the formation of the Pt layer except that a metallic Ti target was used instead of the metallic Pt target.

Next, LaNiO$_3$ layer 13 (with a thickness of 200 nm) having a (001) orientation was formed by RF magnetron sputtering on the surface of the Pt layer. This LaNiO$_3$ layer 13 was formed using LaNiO$_3$ having stoichiometry composition as a target in a mixed gas atmosphere of Ar and oxygen (with a flow ratio between Ar and O$_2$ of 80:20) under the layer formation conditions of an RF power of 100 W and a substrate temperature of 300 degrees Celsius.

Next, a (Na$_x$Bi$_y$)TiO$_{0.5x+1.5y+2}$—BaTiO$_3$ layer 15 (x=0.37 and y=0.58) (with a thickness of 2.7 μm) having composition around the Morphotropic Phase Boundary was formed by RF magnetron sputtering on the surface of the LaNiO$_3$ layer 13. This layer is a piezoelectric layer. This layer 15 was formed using a target having the above-mentioned composition in a mixed gas atmosphere of Ar and oxygen (with a flow ratio between Ar and O$_2$ of 50:50) under the layer formation conditions of an RF power of 170 W and a substrate temperature of 650 degrees Celsius.

The composition of the formed (Na$_x$Bi$_y$)Ti$_{0.5x+1.5y+2}$—BaTiO$_3$ layer 15 (x=0.37 and y=0.58) was analyzed by energy dispersive X-ray spectrometry (SEM-EDX). In the measurement with use of the SEM-EDX, it was difficult to quantify a light element such as oxygen (O) accurately, since the analysis accuracy of the light element was low. However, it was confirmed that the composition of Na, Bi, Ba, and Ti contained in the formed (Na$_x$Bi$_y$)TiO$_{0.5x+1.5y+2}$—BaTiO$_3$ layer 15 (x=0.37 and y=0.58) was identical to the composition of the target.

The formed (Na$_x$Bi$_y$)TiO$_{0.5x+1.5y+2}$—BaTiO$_3$ layer 15 (x=0.37 and y=0.58) was subjected to an X-ray diffraction analysis to analyze the crystal structure thereof. The X-ray diffraction analysis was carried out in such a manner that the surface of the (Na$_x$Bi$_y$)TiO$_{0.5x+1.5y+2}$—BaTiO$_3$ layer 15 was irradiated with an X-ray beam.

Figure 9:
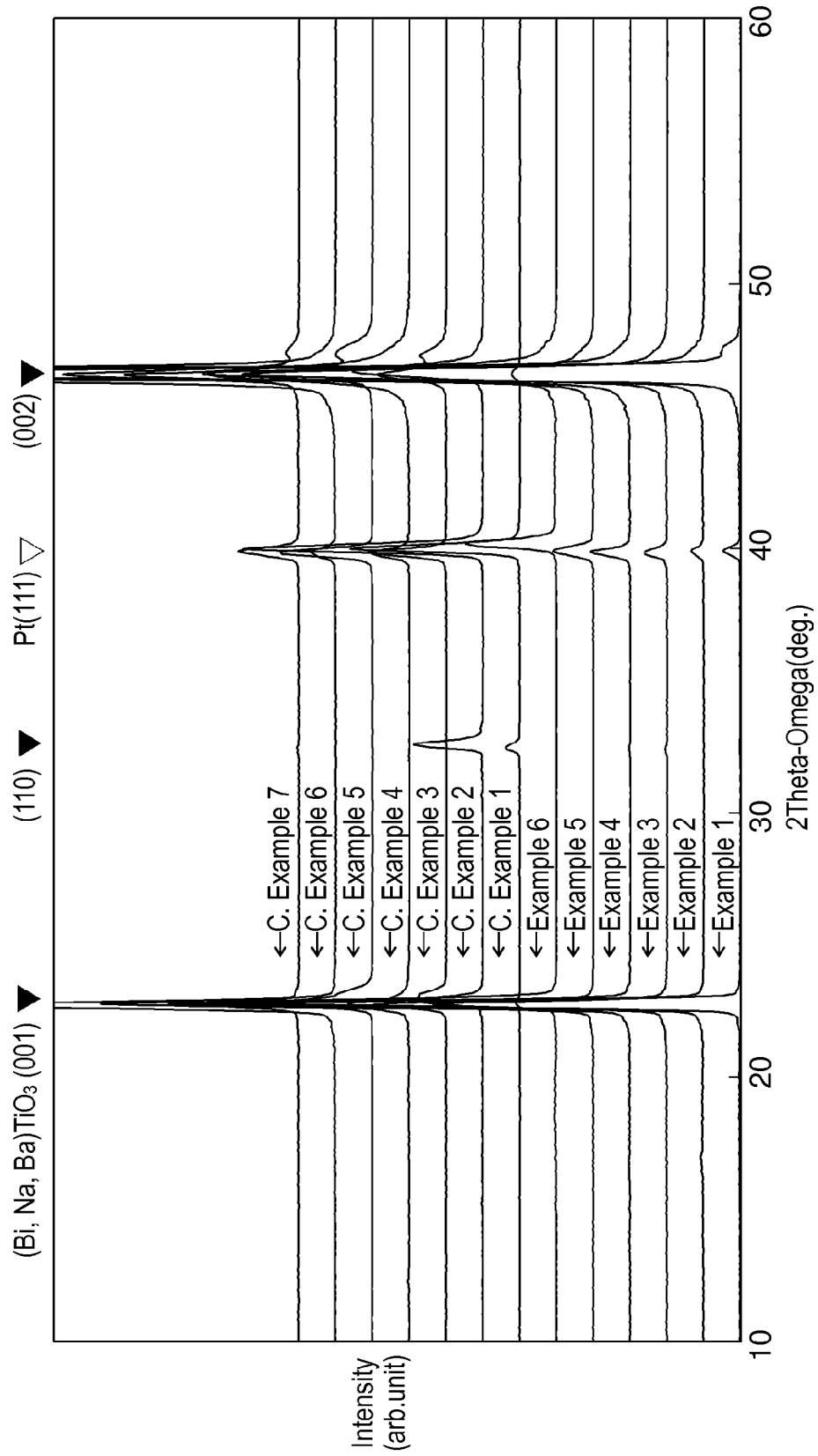
FIG. 9 is a diagram showing X-ray diffraction profiles of piezoelectric films fabricated in the examples 1-6 and the comparative examples 1-7.

FIG. 9 shows the result. In the following comparative examples and comparative examples, the identical X-ray diffraction analysis was used.

FIG. 9 shows the results of the X-ray diffraction profile. Observed was only the reflection peak derived from the (001)-oriented (Na$_x$Bi$_y$)TiO$_{0.5x+1.5y+2}$—BaTiO$_3$ layer 15, except for the reflection peaks derived from the Si substrate and the Pt layer. The intensity of the (110) reflection peak was 22,616 cps, which was a very high level. The profile shown in FIG. 9 means that the obtained (Na$_x$Bi$_y$)TiO$_{0.5x+1.5y+2}$—BaTiO$_3$ layer 15 fabricated in the example has a significantly high (001) orientation.

Subsequently, the half value width of the (001) reflection peak derived from the (Na$_x$Bi$_y$)TiO$_{0.5x+1.5y+2}$—BaTiO$_3$ layer 15 in the obtained X-ray diffraction profile was obtained by rocking curve measurement. The rocking curve measurement is a measurement in which the incident angle ω of the X-ray beam to the sample is scanned while the detector is fixed to the diffraction angle 2θ of the reflection peak to be measured. The obtained half value width corresponds to the degree of tilt of the crystallographic axis in the direction perpendicular to the main surface of the layer. The smaller half value width is, the higher crystallinity becomes. As a result, the obtained half value width was a very small value of 1.4°. This means that the (Na$_x$Bi$_y$)TiO$_{0.5x+1.5y+2}$—BaTiO$_3$ layer 15 fabricated in the example 1 has extremely high crystallinity. In the comparative examples below, the same rocking curve measurement was used to measure the half value widths of the reflection peaks.

Next, an Au layer with a thickness of 100 nanometers was formed by vapor deposition on the surface of the (Na$_x$Bi$_y$)TiO$_{0.5x+1.5y+2}$—BaTiO$_3$ layer 15. This Au layer corresponds to the second electrode 17. Thus, the piezoelectric film according to the example was prepared.

The ferroelectric property and piezoelectric performance of the piezoelectric film were evaluated. FIG. 10 shows a P-E hysteresis loop of the piezoelectric film according to the example 1.

As shown in FIG. 10, it was confirmed that the piezoelectric film exhibited better ferroelectric properties with an increase in the voltage applied to the piezoelectric layer through the Pt layer and the Au layer. An impedance analyzer was used to measure the dielectric loss (tan δ) at 1 kHz. As a result, the value of tan δ of the piezoelectric film was 3.9%. This means that the leak current of the piezoelectric film is small.

The piezoelectric performance of the piezoelectric film was evaluated in the following manner. The piezoelectric film was cut into a strip with a width of 2 mm and worked into a cantilever shape. A potential difference was applied between the Pt layer and the Au layer, and the resulting displacement of the cantilever was measured with a laser displacement meter. The measured displacement was converted into a piezoelectric constant d$_{31}$ to evaluate the piezoelectric performance.

The piezoelectric constant d$_{31}$ (10 volts/micrometer) of the piezoelectric film according to the example 1 in the high electric field (10 volts/micrometer) was a high value of −85 pC/N. The linearity of the piezoelectric performance was estimated from the ratio of the d$_{31}$ (10 volts/micrometer) in the high electric field (10 volts/micrometer) and the d$_{31}$ (3 volts/micrometer) in the low electric field (3 volts/micrometer). The value of the d$_{31}$ (3 volts/micrometer)/d$_{31}$ (10 volts/micrometer) was 1.02. This means that the amount of the deformation was proportional to the applied electric field.

Example 2

An identical experiment to that of the example 1 was performed except for x=0.30 and y=0.56.

The intensity of the (001) reflection peak according to the example 2 was very strong value of 14,783 cps. The piezoelectric constant d$_{31}$ of the piezoelectric film in the high electric field (10 volts/micrometer) was a high value of −73 pC/N. The value of the d$_{31}$ (3 volts/micrometer)/d$_{31}$ (10 volts/micrometer) was 0.81. This means that the amount of the deformation was proportional to the applied electric field.

Example 3

An identical experiment to that of the example 1 was performed except for x=0.46 and y=0.55.

The intensity of the (001) reflection peak according to the example 3 was very strong value of 10,029 cps. The piezoelectric constant d$_{31}$ (10 volts/micrometer) of the piezoelectric film in the high electric field (10 volts/micrometer) was −66 pC/N. The value of the $d_{31}$ (3 volts/micrometer)/$d_{31}$ (10 volts/micrometer) was 1.18. This means that the amount of the deformation was proportional to the applied electric field.

Example 4

An identical experiment to that of the example 1 was performed except for x=0.38 and y=0.51.

The intensity of the (001) reflection peak according to the example 4 was very strong value of 21,841 cps. The piezoelectric constant $d_{31}$ (10 volts/micrometer) of the piezoelectric film in the high electric field (10 volts/micrometer) was −81 pC/N. The value of the $d_{31}$ (3 volts/micrometer)/$d_{31}$ (10 volts/micrometer) was 0.91. This means that the amount of the deformation was proportional to the applied electric field.

Example 5

An identical experiment to that of the example 1 was performed except for x=0.39 and y=0.62.

The intensity of the (001) reflection peak according to the example 5 was very strong value of 9,546 cps. The piezoelectric constant $d_{31}$ (10 volts/micrometer) of the piezoelectric film in the high electric field (10 volts/micrometer) was −62 pC/N. The value of the $d_{31}$ (3 volts/micrometer)/$d_{31}$ (10 volts/micrometer) was 1.04. This means that the amount of the deformation was proportional to the applied electric field.

Example 6

An identical experiment to that of the example 1 was performed except that manganese with a concentration of 0.2 mol % was added as an additive to the $(Na_xBi_y)TiO_{0.5x+1.5y+2}$—$BaTiO_3$ layer (x=0.36 and y=0.58) having composition around the Morphotropic Phase Boundary.

The intensity of the (001) reflection peak according to the example 6 was very strong value of 15,508 cps. The piezoelectric constant $d_{31}$ (10 volts/micrometer) of the piezoelectric film in the high electric field (10 volts/micrometer) was −92 pC/N. The value of the $d_{31}$ (3 volts/micrometer)/$d_{31}$ (10 volts/micrometer) was 0.99. This means that the amount of the deformation was proportional to the applied electric field.

Comparative Example 4

An identical experiment to that of the example 1 was performed except for x=0.28 and y=0.58.

The (001) reflection peak intensity according to the comparative example 4 was a very weak value of 2,685 cps. The piezoelectric constant $d_{31}$ in the high electric field (10 volts/micrometer) was −48 pC/N. The value of $d_{31}$ (3 volts/micrometer)/$d_{31}$ (10 volts/micrometer) was 0.77. The amount of the deformation varied with regard to the applied electric field like a quadratic function.

Comparative Example 5

An identical experiment to that of the example 1 was performed except for x=0.48 and y=0.59.

The (001) reflection peak intensity according to the comparative example 5 was a very weak value of 4,188 cps. The piezoelectric constant $d_{31}$ in the high electric field (10 volts/micrometer) was −52 pC/N. The value of $d_{31}$ (3 volts/micrometer)/$d_{31}$ (10 volts/micrometer) was 1.23. The amount of the deformation varied with regard to the applied electric field like a quadratic function.

Comparative Example 6

An identical experiment to that of the example 1 was performed except for x=0.36 and y=0.50.

The (001) reflection peak intensity according to the comparative example 6 was a very strong value of 15,730 cps. The piezoelectric constant $d_{31}$ of the piezoelectric film was a high value of −84 pC/N similar to the value of the example 1. However, the value of d31 (3 volts/micrometer)/d31 (10 volts/micrometer) was 0.75. The amount of the deformation varied with regard to the applied electric field like a quadratic function.

Comparative Example 7

An identical experiment to that of the example 1 was performed except for x=0.40 and y=0.65.

The (001) reflection peak intensity according to the comparative example 7 was a very weak value of 3,407 cps. The leak current of the piezoelectric film fabricated in the comparative example 7 was very great. The piezoelectric constant $d_{31}$ was −5 pC/N.

The following Table 1 summarizes the evaluation results of the examples 1-6 and the comparative examples 1-7.

TABLE 1

| | Base substrate | Electrode | Composition of piezoelectric layer | | | crystal orientation of the piezoelectric layer | | piezoelectric property | | |
|---|---|---|---|---|---|---|---|---|---|---|
| | | | x | y | additive | orientation direction | (001) peak intensity effect | piezoelectric constant | $d_{31}$ (3 volt/micrometer)/ $d_{31}$ (10 volt/micrometer) | effect |
| Comparative example 1 | Si(100) | Pt(111) | 0.5 | 0.5 | — | (001) + (110) | 193 cps — | — | — | — |
| Comparative example 2 | Si(100) | Pt(111)/LaNiO$_3$(001) | 0.5 | 0.5 | — | (001) + (110) | 2,661 cps — | −40 pC/N | — | — |
| Comparative example 3 | Si(100) | Pt(111)/LaNiO$_3$(001) | 0.29 | 0.43 | — | (001) | 2,548 cps Poor | −56 pC/N | 0.54 (quadric) | Poor |
| Comparative example 4 | Si(100) | Pt(111)/LaNiO$_3$(001) | 0.28 | 0.58 | — | (001) | 2,685 cps Poor | −48 pC/N | 0.77 (quadric) | Poor |
| Example 2 | Si(100) | Pt(111)/LaNiO$_3$(001) | 0.30 | 0.56 | — | (001) | 14,783 cps Good | −73 pC/N | 0.81 (linear) | Good |
| Example 1 | Si(100) | Pt(111)/LaNiO$_3$(001) | 0.37 | 0.58 | — | (001) | 22,616 cps Excellent | −85 pC/N | 1.02 (linear) | Excellent |
| Example 3 | Si(100) | Pt(111)/LaNiO$_3$(001) | 0.46 | 0.55 | — | (001) | 10,029 cps Good | −66 pC/N | 1.18 (linear) | Good |
| Comparative example 5 | Si(100) | Pt(111)/LaNiO$_3$(001) | 0.48 | 0.59 | — | (001) | 4,188 cps Poor | −52 pC/N | 1.23 (quadric) | Poor |
| Comparative example 6 | Si(100) | Pt(111)/LaNiO$_3$(001) | 0.36 | 0.50 | — | (001) | 15,730 cps Good | −84 pC/N | 0.75 (quadric) | Poor |

TABLE 1-continued

| | Base | | Composition of piezoelectric layer | | | crystal orientation of the piezoelectric layer | | piezoelectric property | | |
|---|---|---|---|---|---|---|---|---|---|---|
| | sub-strate | Electrode | x | y | addi-tive | orientation direction | (001) peak intensity effect | piezoelectric constant | $d_{31}$ (3 volt/micrometer)/ $d_{31}$ (10 volt/micrometer) | effect |
| Example 4 | Si(100) | Pt(111)/LaNiO$_3$(001) | 0.38 | 0.51 | — | (001) | 21,841 cps Excellent | −81 pC/N | 0.91 (linear) | Good |
| Example 5 | Si(100) | Pt(111)/LaNiO$_3$(001) | 0.39 | 0.62 | — | (001) | 9,546 cps Good | −62 pC/N | 1.04 (linear) | Good |
| Comparative example 7 | Si(100) | Pt(111)/LaNiO$_3$(001) | 0.40 | 0.65 | — | (001) | 3,407 cps Poor | −5 pC/N | — | Poor |
| Example 6 | Si(100) | Pt(111)/LaNiO$_3$(001) | 0.36 | 0.58 | Mn | (001) | 15,508 cps Good | −92 pC/N | 0.99 (linear) | Excellent |

As shown in Table 1, the (Na$_x$Bi$_y$)TiO$_{0.5x+1.5y+2}$—BaTiO$_3$ layer (0.30≤x≤0.46 and 0.51≤y≤0.62) with a (001) orientation formed on the LaNiO$_3$ layer with a (001) orientation formed on the Si substrate has a high (001) orientation and high crystallinity.

The examples 1, 2 and 3 and the comparative examples 4 and 5 mean that the (Na$_x$Bi$_y$)TiO$_{0.5x+1.5y+2}$—BaTiO$_3$ layer (0.30≤x≤0.46) has a high (001) orientation, a high crystallinity, and a high piezoelectric constant.

The example 3 and the comparative example 5 mean that x must not be over 0.46.

The example 2 and the comparative example 4 mean that x must not be less than 0.30.

The examples 1, 4 and 5 and the comparative examples 6 and 7 mean that the (Na$_x$Bi$_y$)TiO$_{0.5x+1.5y+2}$—BaTiO$_3$ layer where the amount of the deformation is proportional to the applied electric field cannot be obtained when the (Na$_x$Bi$_y$)TiO$_{0.5x+1.5y+2}$—BaTiO$_3$ layer (0.51≤y≤0.62) is not used.

The example 5 and the comparative example 7 mean that y must not be over 0.62.

The example 4 and the comparative example 3 mean that y must not be less than 0.51.

The example 6 means that the addition of manganese improves the piezoelectric constant of the (Na$_x$Bi$_y$)TiO$_{0.5x+1.5y+2}$—BaTiO$_3$ layer.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

INDUSTRIAL APPLICABILITY

The piezoelectric film of the present invention has a high ferroelectric property (for example, low dielectric loss) and a high piezoelectric performance, since the (Na$_x$Bi$_y$)TiO$_{0.5x+1.5y+2}$—BaTiO$_3$ layer (0.30≤x≤0.46 and 0.51≤y≤0.62) has a high crystallinity, a high (001) orientation, and a small leak current.

The piezoelectric film according to the present invention is useful as a piezoelectric film alternative to a conventional lead-containing oxide ferroelectrics, since the ratio of the piezoelectric constant in the low electric field to the piezoelectric constant in the high electric field falls within the good linear electric field-deformation range of 0.8 to 1.2.

The piezoelectric film of the present invention can be used suitably for applications such as pyroelectric sensors and piezoelectric devices in which piezoelectric films are used.

Examples of such applications are the ink jet head, angular velocity sensor and piezoelectric generating element of the present invention.

The ink jet head of the present invention has excellent ink ejection characteristics although it does not contain a lead-containing ferroelectric material such as PZT. The method of forming an image by this ink jet head has high image forming accuracy and high expressivity.

The angular velocity sensor of the present invention has high sensor sensitivity although it does not contain a lead-containing ferroelectric material such as PZT. The method of measuring an angular velocity by this angular velocity sensor has excellent measurement sensitivity.

The piezoelectric generating element of the present invention has excellent electric power generation characteristics although it does not contain a lead-containing ferroelectric material such as PZT. The electric power generation method of the present invention using this piezoelectric generating element has high electric power generation efficiency.

The ink jet head, angular velocity sensor and piezoelectric generating element, and the image forming method, angular velocity measurement method and electric power generation method according to the present invention can be widely applied to various fields and uses.

REFERENCE MARKS IN THE DRAWINGS 11 substrate
12 metal electrode layer
13 LaNiO$_3$ layer (first electrode)
15 (Na$_x$Bi$_y$)TiO$_{0.5x+1.5y+2}$—BaTiO$_3$ layer (0.30≤x≤0.46 and 0.51≤y≤0.62) layer
17 conductive layer (second electrode)
101 through-holes
102 pressure chambers
102a walls
102b walls
103 individual electrode layer
104 piezoelectric film
105 common liquid chambers
106 supply port
107 ink passage
108 nozzle hole
111 vibration layer
112 common electrode layer
113 intermediate layer
114 adhesive layer
120 base substrate
130 Si substrate
200 substrate
200a stationary part
200b vibration part 202 first electrode
205 second electrode
206 drive electrode
206a connection terminal
207 sense electrode
207a connection terminal
208 piezoelectric film
300 substrate
300a stationary part
300b vibration part
302 first electrode
305 second electrode
306 weight load

The invention claimed is:

1. A method of measuring an angular velocity with an angular velocity sensor, comprising steps of:

a step (a) of preparing the angular velocity sensor comprising a substrate having a vibration part and a piezoelectric film bonded to the vibration part, wherein, the piezoelectric film comprises a piezoelectric layer, a first electrode and a second electrode;

the piezoelectric layer is interposed between the first electrode and the second electrode;

the first electrode comprises an electrode layer with a (001) orientation;

the piezoelectric layer comprises a $(Na_xBi_y)TiO_{0.5x+1.5y+2}$—$BaTiO_3$ layer with a (001) orientation only;

x is not less than 0.30 and not more than 0.46;

y is not less than 0.51 and not more than 0.62;

the $(Na_xBi_y)TiO_{0.5x+1.5y+2}$—$BaTiO_3$ layer has composition around a Morphotropic Phase Boundary; and one of the first and second electrodes selected therefrom is constituted of an electrode group including a drive electrode and a sense electrode;

a step (b) of applying a driving voltage to the piezoelectric layer through the drive electrode and the other of the first and second electrodes selected therefrom to oscillate the vibration part; and a step (c) of measuring, through the other electrode and the sense electrode, a deformation of the vibration part caused by an angular velocity applied to the oscillating vibration part to obtain a value of the applied angular velocity;

wherein an amount B of the deformation B of the piezoelectric film and an electric field A between the first electrode and the second electrode satisfy the following equation:

$$B=cA \text{ (}c \text{ is a constant)}.$$

2. The method according to claim 1, wherein the material of the substrate is Si, glass, or ceramics.

3. The method according to claim 2, wherein the material of the substrate is Si.

* * * * *